United States Patent
Ohtani et al.

(10) Patent No.: US 11,633,810 B2
(45) Date of Patent: Apr. 25, 2023

(54) WORKPIECE-SEPARATING DEVICE AND WORKPIECE-SEPARATING METHOD

(71) Applicant: SHIN-ETSU ENGINEERING CO., LTD., Tokyo (JP)

(72) Inventors: Yoshikazu Ohtani, Gunma (JP); Kyouhei Tomioka, Gunma (JP)

(73) Assignee: SHIN-ETSU ENGINEERING CO., LTD., Tokyo (JP)

( * ) Notice: Subject to any disclaimer, the term of this patent is extended or adjusted under 35 U.S.C. 154(b) by 0 days.

(21) Appl. No.: 17/777,879

(22) PCT Filed: Oct. 27, 2020

(86) PCT No.: PCT/JP2020/040282
§ 371 (c)(1),
(2) Date: May 18, 2022

(87) PCT Pub. No.: WO2021/100421
PCT Pub. Date: May 27, 2021

(65) Prior Publication Data
US 2022/0410321 A1    Dec. 29, 2022

(30) Foreign Application Priority Data

Nov. 20, 2019  (JP) .............................. JP2019-209839

(51) Int. Cl.
*B23K 26/57* (2014.01)
*H01L 21/683* (2006.01)
(Continued)

(52) U.S. Cl.
CPC ............ *B23K 26/57* (2015.10); *B23K 26/082* (2015.10); *H01L 21/268* (2013.01); *H01L 21/683* (2013.01)

(58) Field of Classification Search
CPC ..... B23K 26/082; B23K 26/57; H01L 21/268; H01L 21/683
(Continued)

(56) References Cited

U.S. PATENT DOCUMENTS

| 8,431,428 B2 * | 4/2013 | Sekiya | ................. B28D 5/0011 438/33 |
| 10,081,076 B2 * | 9/2018 | Hirata | ................. B23K 26/702 |

(Continued)

FOREIGN PATENT DOCUMENTS

| CN | 112166495 | 1/2021 |
| JP | 2003-260579 | 9/2003 |

(Continued)

OTHER PUBLICATIONS

Office Action, Korean Patent Office, in counterpart Korean Patent Application No. 10-2022-7017153, dated Jul. 1, 2022, (with English translation).

(Continued)

*Primary Examiner* — Dana Ross
*Assistant Examiner* — Joseph W Iskra
(74) *Attorney, Agent, or Firm* — Greenblum & Bernstein, P.L.C.

(57) ABSTRACT

A workpiece-separating device includes: a holding member which detachably holds one of the workpiece and the supporting body; a laser irradiation part which irradiates the separating layer with the laser beam through the other of the supporting body and the workpiece of the laminated body being held by the holding member; and a controlling part which controls an operation of the laser irradiation part, wherein the laser irradiation part has a laser scanner which moves the spot like laser beam along the laminated body, an entire irradiated face of the separating layer in an area of the laser beam irradiated from the laser scanner toward the (Continued)

laminated body is divided into a plurality of irradiation areas each having a band shape that is elongated in one of two directions intersecting a light irradiation direction from the laser irradiation part.

9 Claims, 12 Drawing Sheets

(51) Int. Cl.
*H01L 21/268* (2006.01)
*B23K 26/082* (2014.01)

(58) Field of Classification Search
USPC .................................................... 219/121.69
See application file for complete search history.

(56) References Cited

U.S. PATENT DOCUMENTS

| | | | |
|---|---|---|---|
| 11,469,094 B2 * | 10/2022 | Hirata | H01L 21/02013 |
| 2011/0017280 A1 | 1/2011 | Rumsby | |
| 2013/0119031 A1 * | 5/2013 | Matsuda | B23K 26/40 |
| | | | 219/121.85 |
| 2019/0039318 A1 | 2/2019 | Madigan et al. | |
| 2021/0245297 A1 | 8/2021 | Ohtani et al. | |

FOREIGN PATENT DOCUMENTS

| | | |
|---|---|---|
| JP | 2003-275886 | 9/2003 |
| JP | 2008-229682 | 10/2008 |
| JP | 2010-184291 | 8/2010 |
| JP | 2012-15150 | 1/2012 |
| JP | 2012-24783 | 2/2012 |
| JP | 2012-81478 | 4/2012 |
| JP | 2013-158779 | 8/2013 |
| JP | 2013-179237 | 9/2013 |
| WO | 2012/002155 | 1/2012 |
| WO | 2012/108056 | 8/2012 |
| WO | 2013/115351 | 8/2013 |

OTHER PUBLICATIONS

International Search Report in International Patent Application No. PCT/JP2020/040282, dated Jan. 19, 2021 (with English translation).
Written Opinion of the International Searching Authority in International Patent Application No. PCT/JP2020/040282, dated Jan. 19, 2021 (with English translation).
International Preliminary Report on Patentability (Chapter II of the Patent Cooperation Treaty) in International Patent Application No. PCT/JP2020/040282, dated Jul. 2, 2021 (with English translation).
Decision to Grant a Patent (Office Action), Japan Patent Office, in counterpart Japanese Patent Application No. 2021-549618, dated Oct. 12, 2021 (with English translation).
Office Action, China Patent Office, in counterpart Chinese Patent Application No. 202080076920.5, dated Aug. 12, 2022 (with English translation).

* cited by examiner

WORKPIECE-SEPARATING DEVICE AND WORKPIECE-SEPARATING METHOD

TECHNICAL FIELD

The present invention relates to a workpiece-separating device which is used in a manufacturing process of a workpiece that is to become a product, such as WLP (wafer level packaging), PLP (panel level packaging), or a treatment process of an extremely thin semiconductor wafer (an ultrathin semiconductor wafer) in order to peel, from a supporting body, the workpiece being temporarily fastened and held by the supporting body and to a workpiece-separating method which uses the workpiece-separating device.

BACKGROUND ART

Conventionally, as a workpiece-separating device and a workpiece-separating method of this type, there is a laser lift-off method in which a workpiece constructed by forming a crystal layer on a substrate is irradiated with a pulse laser beam through the substrate while constantly changing an irradiation area of the pulse laser beam to the workpiece so that ends of irradiation areas adjacent to each other in a direction of movement of the irradiation areas are superimposed on each other and that ends of irradiation areas adjacent to each other in a direction perpendicular to the direction of movement of the irradiation areas are superimposed on each other, thereby peeling the crystal layer from the substrate at an interface between the substrate and the crystal layer (for example, refer to PTL 1).

The workpiece is divided into irradiation areas of which sizes correspond to one shot (one pulse) of the pulse laser beam, and an irradiating method of the pulse laser beam from a laser optical system to the workpiece with respect to each irradiation area involves respectively performing one irradiation of the pulse laser beam with respect to each irradiation area while causing ends (edge parts) of the irradiation areas to be superimposed on each other by carrying the workpiece.

The pulse laser beam that is generated by a laser source passes through the laser optical system and is projected onto the workpiece, and radiates an interface between a substrate and a crystal layer (a material layer made of a GaN-based compound) through the substrate. At the interface between the substrate and the material layer, the irradiation of the pulse laser beam causes GaN of the material layer near the interface with the substrate to decompose and causes the material layer to be peeled away from the substrate.

In addition, as another workpiece-separating device, there is a lift-off device in which laser beam irradiating means is operated in a state where a composite substrate is suctioned and held by holding means to irradiate a buffer layer with a laser beam from an epitaxy substrate side of the composite substrate to destroy the buffer layer, and epitaxy substrate peeling means is subsequently operated to peel the epitaxy substrate away from an optical device layer (for example, refer to PTL 2).

The laser beam irradiating means is equipped with: pulse laser beam oscillating means; a scanner which deflects an optical axis of a pulse laser beam in an X-axis direction and a Y-axis direction; and a collector constituted of an image-side telecentric objective lens which collects the pulse laser beam of which an optical axis has been deflected by the scanner and which irradiates the composite substrate being held by a holding table. When the pulse laser beam oscillating means is operated, the pulse laser beam oscillating means swings the scanner in the X-axis direction and the Y-axis direction so that an entire surface of the buffer layer is irradiated by a pulse laser beam, of which a spot forms a spiral shape, from the collector.

CITATION LIST

Patent Literature

[PTL 1] Japanese Patent Application Laid-open No. 2012-024783

[PTL 2] Japanese Patent Application Laid-open No. 2013-179237

SUMMARY OF INVENTION

Technical Problem

However, with the device described in PTL 1, since a size of each irradiation area corresponding to one shot of a pulse laser beam is large, the pulse laser beam that irradiates each irradiation area from a laser optical system cannot be sufficiently concentrated. Accordingly, an energy amount (energy density) of the pulse laser beam irradiating each irradiation area sometimes fails to reach a level that enables an entire surface of a crystal layer (a material layer of a GaN-based compound) to be uniformly decomposed.

Therefore, an increased likelihood of a partial occurrence of an irradiation irregularity by a laser beam with respect to a separating layer of a laminated body causes problems such as an occurrence of a partial peeling failure of a region where laser output had been insufficient or an unirradiated region in the separating layer, an occurrence of damage to a device formed on a circuit substrate of a chip being mounted to the substrate in a region where laser output had conversely been too high, and an occurrence of soot due to excessive irradiation of a laser beam.

With the device described in PTL 2, since a pulse laser beam is irradiated in a spiral pattern due to swinging of the scanner, when entire shapes of the epitaxy substrate and the buffer layer are rectangular, an increased likelihood of occurrence of an unirradiated region makes the device unsuitable and a problem arises in that an entire surface of the rectangles cannot be efficiently peeled.

Solution to Problem

In order to solve the problem, a workpiece-separating device according to the present invention is a workpiece-separating device which, with respect to a laminated body in which a workpiece including a circuit substrate is laminated via a supporting body and a separating layer, peels away the supporting body from the workpiece due to denaturation of the separating layer with an irradiation of a laser beam, the workpiece-separating device including: a holding member which detachably holds one of the workpiece and the supporting body; a laser irradiation part which irradiates the separating layer with the laser beam through the other of the supporting body and the workpiece of the laminated body being held by the holding member; and a controlling part which controls an operation of the laser irradiation part, wherein the laser irradiation part has a laser scanner which moves the spot like laser beam along the laminated body, an entire irradiated face of the separating layer in an area of the laser beam irradiated from the laser scanner toward the laminated body is divided into a plurality of irradiation areas each having a band shape that is elongated in one of two directions intersecting a light irradiation direction from the laser irradiation part, and the irradiation from the laser scanner with respect to each divided irradiation area is an aligned irradiation in which parts of the spot like laser beams are aligned so as to overlap with each other on a plane intersecting the light irradiation direction, and the controlling part exercises control such that the aligned irradiation is performed by an operation of the laser scanner with respect to one irradiation area of the plurality of irradiation areas divided into band shapes, the aligned irradiation is performed with respect to a next irradiation area after an entirety of the one irradiation area of the plurality of irradiation areas is filled by the aligned irradiation in a gapless manner, and the aligned irradiation is subsequently similarly repeated for each of the irradiation areas so that all of the plurality of irradiation areas are eventually subjected to the aligned irradiation.

In addition, in order to solve the problem, a workpiece-separating method according to the present invention is a workpiece-separating method of, with respect to a laminated body in which a workpiece including a circuit substrate is laminated via a supporting body and a separating layer, peeling away the supporting body from the workpiece due to denaturation of the separating layer with an irradiation of a laser beam, the workpiece-separating method including: a holding process of detachably holding one of the workpiece and the supporting body with a holding member; a laser irradiation process of irradiating the separating layer with the laser beam from a laser irradiation part through the other of the supporting body and the workpiece of the laminated body being held by the holding member; and a relative moving process of moving relatively a laser irradiation position from the laser irradiation part with respect to the supporting body and the separating layer of the laminated body being held by the holding member in at least a direction intersecting a laser irradiation direction from the laser irradiation part, wherein the laser irradiation part has a laser scanner which moves the spot like laser beam along the laminated body, in the laser irradiation process, an entire irradiated face of the separating layer in an area of the laser beam irradiated from the laser scanner toward the laminated body is divided into a plurality of irradiation areas each having a band shape that is elongated in one of two directions intersecting a light irradiation direction from the laser irradiation part, and the irradiation from the laser scanner with respect to each divided irradiation area is an aligned irradiation in which parts of the spot like laser beams are aligned so as to overlap with each other on a plane intersecting the light irradiation direction, and in the relative moving process, the aligned irradiation is performed by an operation of the laser scanner with respect to one irradiation area of the plurality of irradiation areas divided into band shapes, the aligned irradiation is performed with respect to a next irradiation area after an entirety of the one irradiation area of the plurality of irradiation areas is filled by the aligned irradiation in a gapless manner, and the aligned irradiation is subsequently similarly repeated for each of the irradiation areas so that all of the plurality of irradiation areas are eventually subjected to the aligned irradiation.

DESCRIPTION OF EMBODIMENTS

Figure 1:
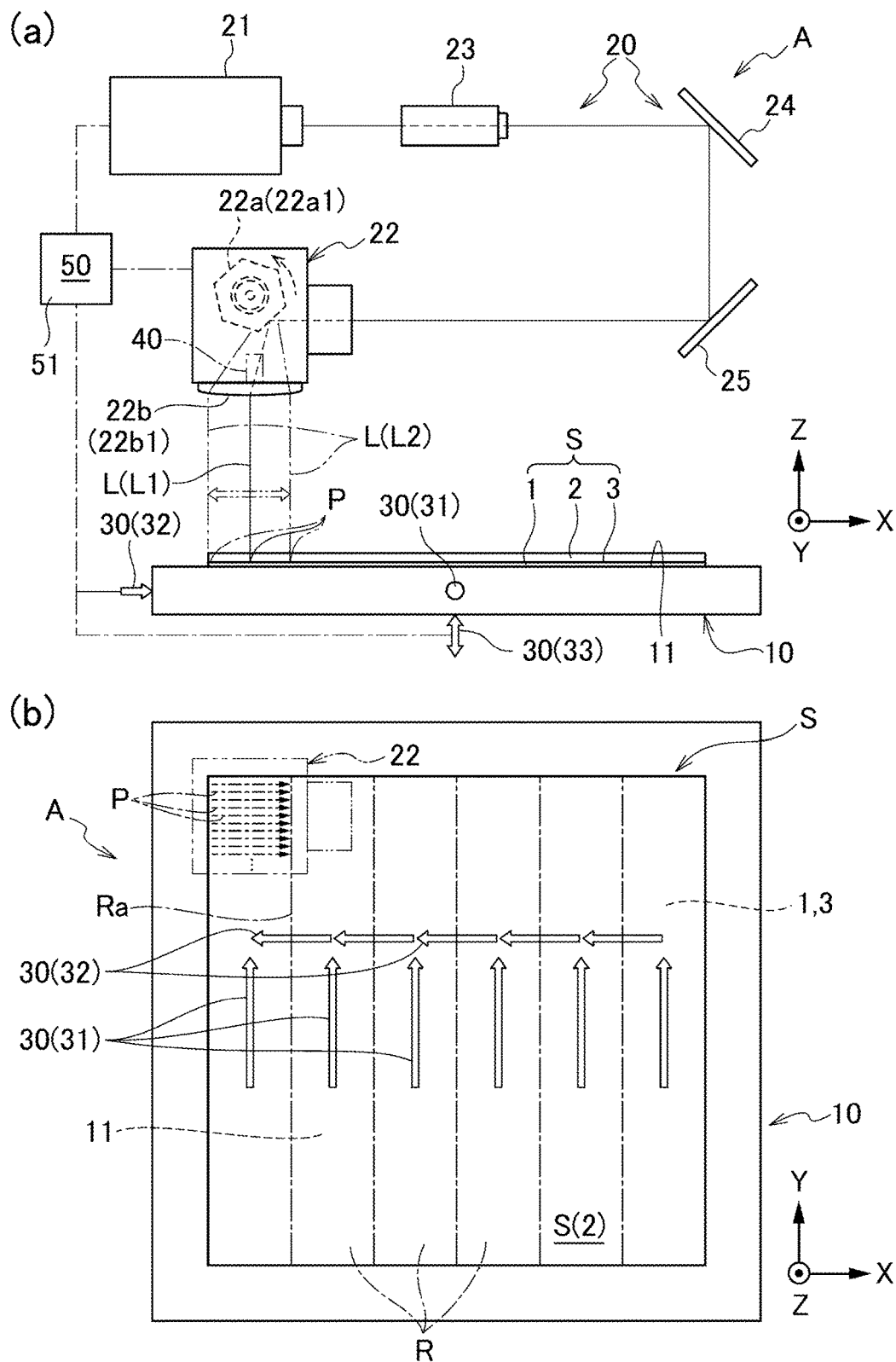
FIG. 1 is an explanatory diagram showing an overall configuration of a workpiece-separating device according to an embodiment of the present invention in which FIG. 1 at (a) is a front view and FIG. 1 at (b) is a lateral plan view of the same.

Hereinafter, an embodiment of the present invention will be described in detail with reference to the drawings.

As shown in FIG. 1 to FIG. 12, a workpiece-separating device A and a workpiece-separating method according to the embodiment of the present invention is a laser lift-off device and a laser lift-off method in which, with respect to a laminated body S constructed by laminating a workpiece 1 including a circuit substrate (not illustrated) via a supporting body 2 and a separating layer 3, the separating layer 3 is irradiated by a laser beam L through the workpiece 1 and the supporting body 2 so that the separating layer 3 absorbs the laser beam L and becomes peelably denatured (changes properties) and the supporting body 2 is peeled away from the workpiece 1. The workpiece-separating device A and the workpiece-separating method according to the embodiment of the present invention are used when manufacturing a semiconductor package such as WLP (wafer level packaging) or PLP (panel level packaging) or during a treatment process of an extremely thin semiconductor wafer (hereinafter, referred to as an "ultrathin wafer").

More specifically, the workpiece-separating device A according to the embodiment of the present invention includes, as primary constituent elements: a holding member 10 which is provided so as to detachably hold the laminated body S; and a laser irradiation part 22 of an optical system 20 which is provided so as to irradiate the separating layer 3 of the laminated body S with the laser beam L from a laser source 21.

Preferably, the workpiece-separating device A further includes: a driving part 30 which is provided so as to relatively move a laser irradiation position P from the laser irradiation part 22 with respect to the supporting body 2 and the separating layer 3; a length measuring part 40 which is provided so as to measure an interval from the laser irradiation part 22 to irradiated faces of the supporting body 2 and the separating layer 3; and a controlling part 50 which is provided to as to control operations of the laser irradiation part 22, the driving part 30, the length measuring part 40, and the like.

It should be noted that, as shown in FIG. 1 to FIG. 12, the laminated body S is normally placed in an up-down direction with respect to the holding member 10 and the laser beam L is irradiated in a downward direction from the laser irradiation part 22 toward the laminated body S on the holding member 10. Hereinafter, a holding direction of the laminated body S with respect to the holding member 10 and an irradiation direction (light irradiation direction) of the laser beam L from the laser irradiation part 22 toward the laminated body S will be referred to as a "Z direction". Hereinafter, two directions that intersect with the irradiation direction of the laser beam L (the Z direction) will be referred to as "XY directions".

The workpiece 1 is made of a carriable substrate or the like including a circuit substrate subjected to a semiconductor process such as a circuit formation treatment or a thinning treatment in a laminated state in which the workpiece 1 is bonded to the supporting body 2 (to be described later) and the workpiece 1 is formed in a thin plate shape from a material such as silicon.

Examples of an overall shape of the workpiece 1 include a rectangular (quadrilaterals with right-angled corners including a rectangle and a square) panel shape and a circular wafer shape.

Examples of a thickness of the workpiece 1 include rectangular and circular substrates thinned down to 15 to 3,000 μm. In particular, in a case of a panel shape or a wafer shape in which the thickness of the workpiece 1 is extremely thin (hereinafter, referred to as "ultrathin") such as around several ten μm, the workpiece 1 can be supported by bonding an entire face of the workpiece 1 to a tape-like holding adhesive sheet such as a dicing tape or the workpiece 1 can be supported by bonding the workpiece 1 to a tape-like holding adhesive sheet such as a dicing frame of which an outer circumference part is reinforced by a holding frame with a square frame shape or a circular frame shape (a ring shape).

The supporting body 2 is referred to as a support substrate or a carrier substrate which has strength required to prevent damage or deformation of the workpiece 1 by supporting the workpiece 1 in a thinning process, various treatment processes, and a carrying process of the workpiece 1. For this reason, the supporting body 2 is formed in a rectangular or circular shape in a size corresponding to the workpiece 1 from a hard and rigid material.

Either one of or both the workpiece 1 and the supporting body 2 is formed of a transparent or translucent rigid material such as glass or synthetic resin through which the laser beam L with a specific wavelength passes. In the case of the illustrated example as a specific example of the supporting body 2, a transparent or translucent glass plate, ceramic plate, or acrylic resin plate through which the laser beam L with a specific wavelength passes is used and a thickness thereof is set to, for example, 300 to 3,000 μm.

The separating layer 3 is a layer which changes its properties by absorbing the laser beam L having been irradiated via the workpiece 1 or the supporting body 2 such that adhesion of the separating layer 3 decreases, and changes its properties such that the separating layer 3 loses its adhesive property when subjected to a slight external force and may peel off or break.

As a material of the separating layer 3, for example, a material such as a polyimide resin which has an adhesive property and which enables the workpiece 1 and the supporting body 2 to be bonded to each other without interposing an adhesion layer made of an adhesive is preferably used. In addition, a different layer that can be readily cleaned and removed after the workpiece 1 and the supporting body 2 are peeled away from each other can also be laminated. Furthermore, when the separating layer 3 is made of a material that does not have an adhesive property, an adhesion layer (not illustrated) made of an adhesive must be provided between the separating layer 3 and the workpiece 1 and the separating layer 3 and the workpiece 1 must be bonded to each other by the adhesion layer.

As the laminated body S, a laminated body of which an overall size in the XY directions is large but a thickness in the Z direction has been reduced is mainly used such as a laminated body of which one side is 500 mm or more in the case of a rectangular shape and of which a diameter is 200 mm or 300 mm or more in the case of a circular shape.

In the cases shown in FIG. 1 to FIG. 3 or FIG. 5 to FIG. 11 as examples of the laminated body S, a panel-shaped (approximately square) laminated body S is used in which a rectangular (approximately square) substrate to become the workpiece 1 and a rectangular (approximately square) support substrate (carrier substrate) to become the supporting body 2 are bonded to each other by the separating layer 3.

Figure 4:
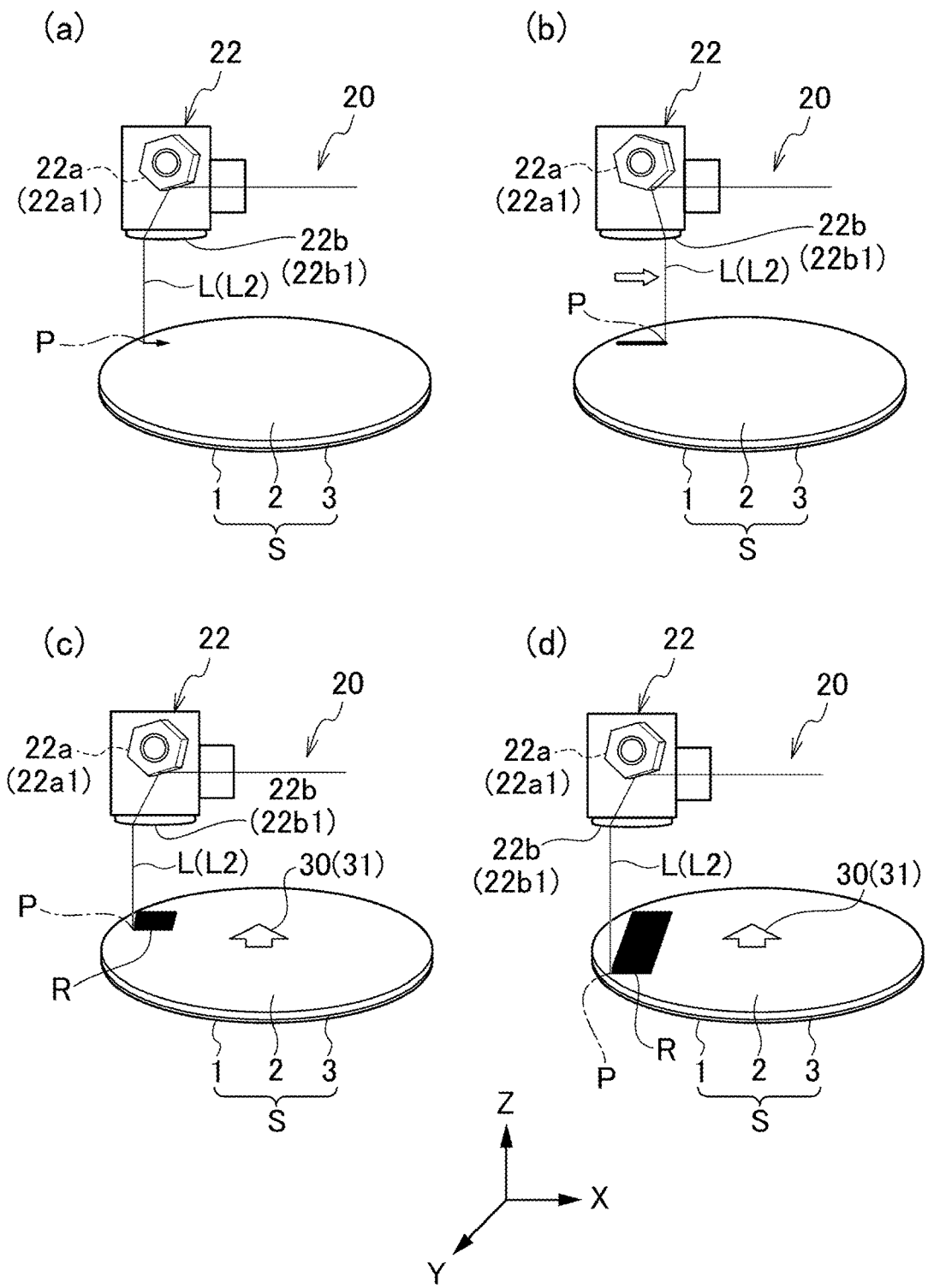
FIG. 4 is an explanatory diagram showing a modification of a laminated body in which FIG. 4 at (a) to FIG. 4 at (d) are partial cutout perspective views showing a laser irradiation process from a laser irradiation part.

In the case shown in FIG. 4 as another example of the laminated body S, a wafer-shaped laminated body S is used in which a circular wafer to become the workpiece 1 and a circular support substrate (carrier substrate) to become the supporting body 2 are bonded to each other by the separating layer 3.

In these illustrated examples, the laser beam L for peeling is set so as to irradiate the separating layer 3 through the supporting body 2 by arranging the laminated body S such that a side of the supporting body 2 opposes the laser irradiation part 22 to be described later.

Figure 9:
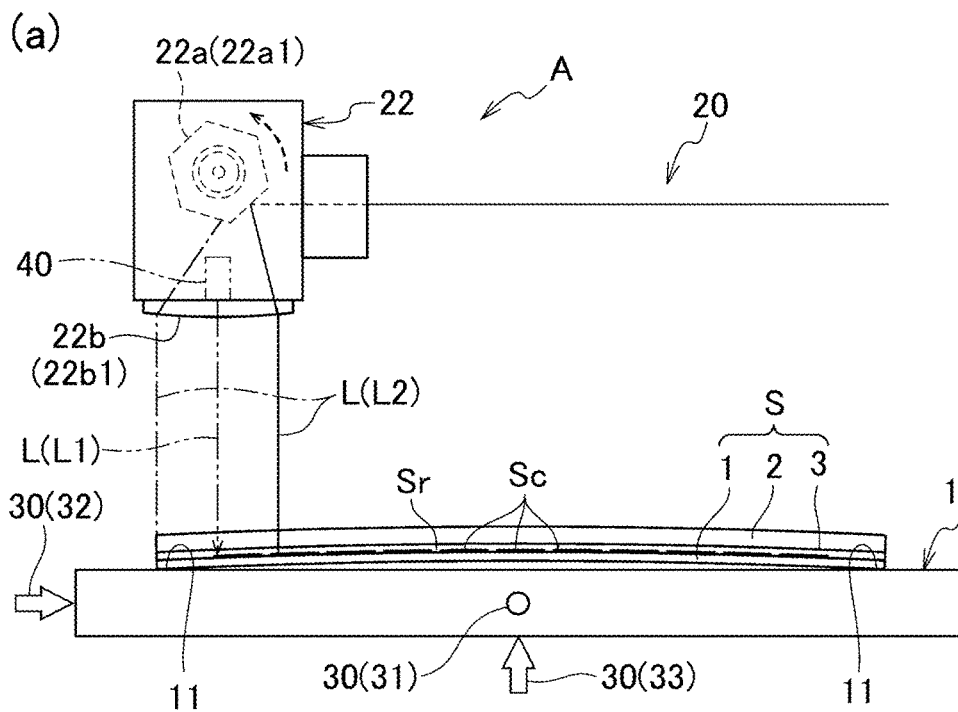
FIG. 9 is an explanatory diagram showing an operation state when holding a laminated body with warpage in which FIG. 9 at (a) and FIG. 9 at (b) are enlarged front views showing a laser irradiation process from a laser irradiation part with respect to a plurality of irradiation areas.
Figure 9:
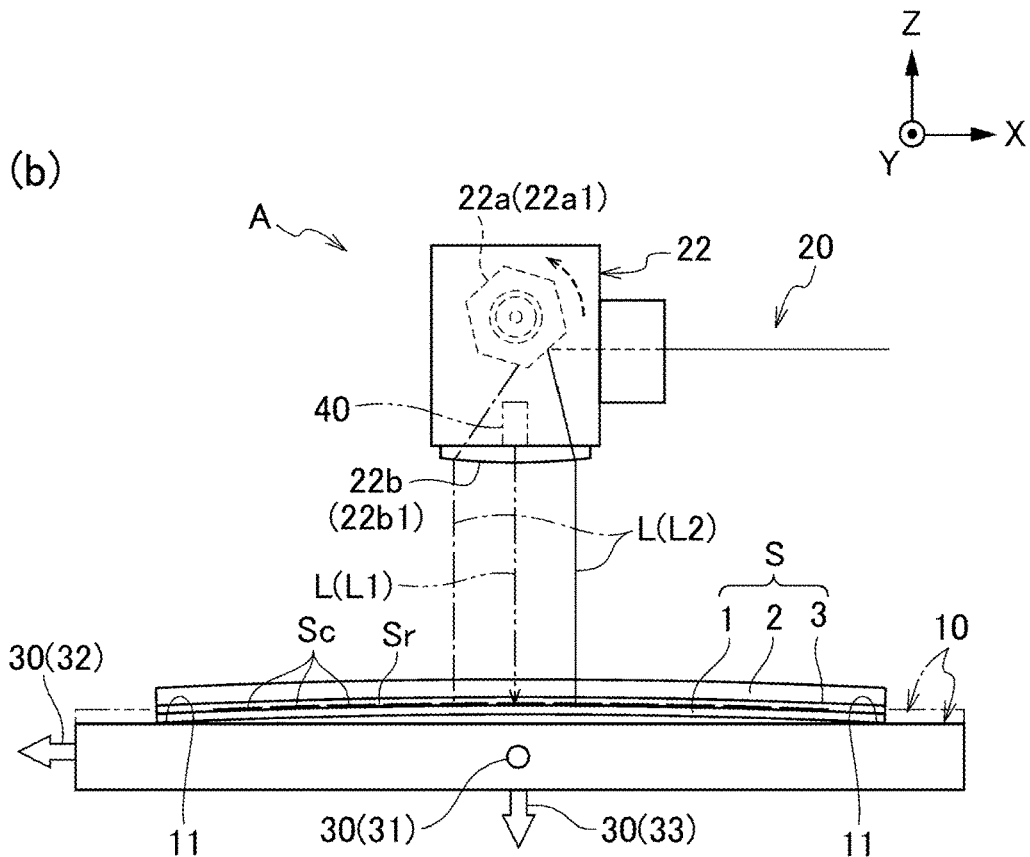
Figure 11:
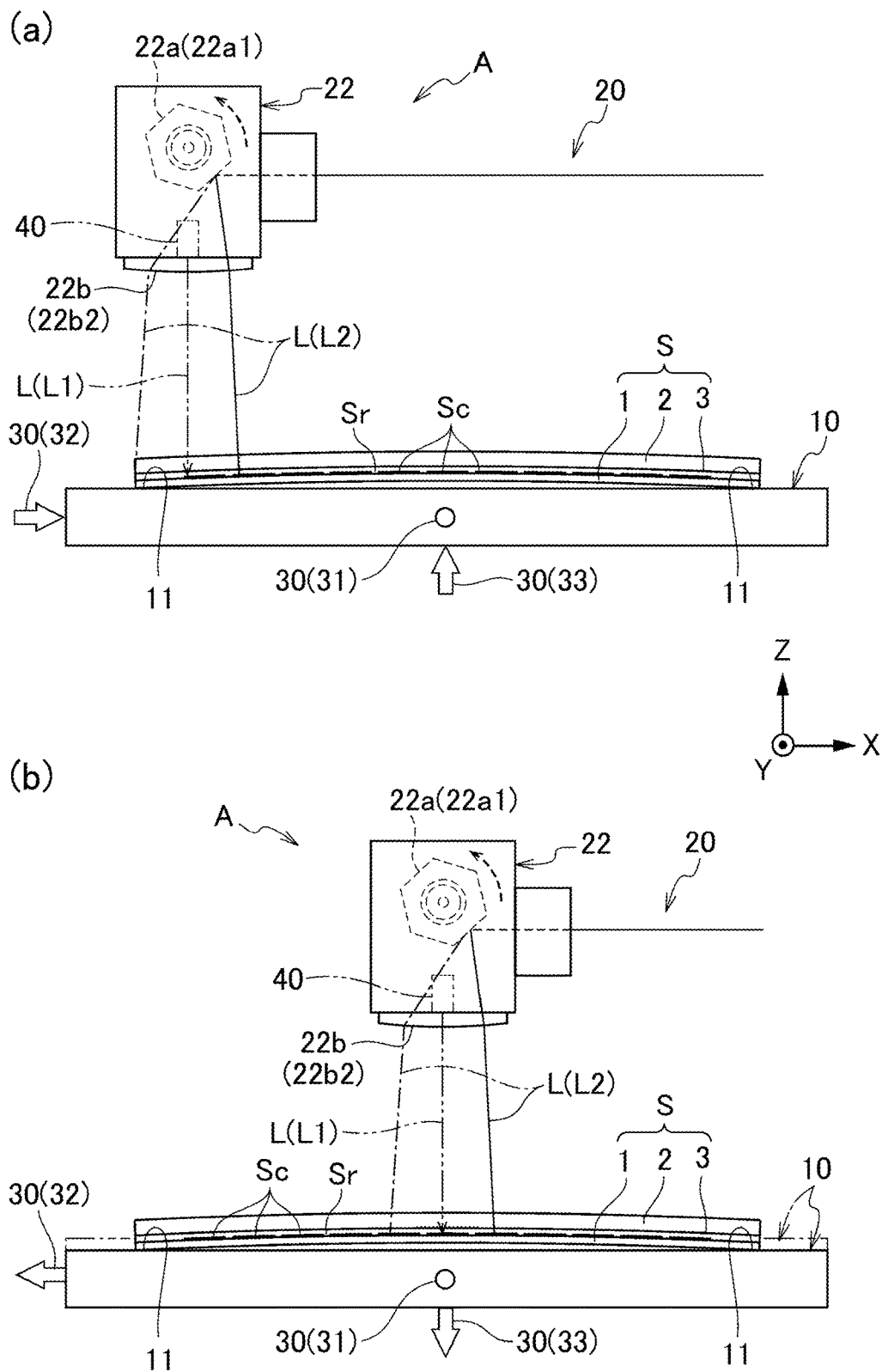
FIG. 11 is an explanatory diagram showing an operation state when holding a laminated body with warpage in which FIG. 11 at (a) and FIG. 11 at (b) are enlarged front views showing a laser irradiation process from a laser irradiation part with respect to a plurality of irradiation areas.

Furthermore, as shown in FIG. 9 at (a) and FIG. 9 at (b) and FIG. 11 at (a) and FIG. 11 at (b), other examples of the laminated body S include a four-layer structure having the workpiece 1 which is manufactured using a fan-out PLP technique or the like, a sealing body implementing sealing with use of a sealing material Sr such as a resin which seals a plurality of semiconductor elements Sc mounted on a surface of the workpiece 1, the separating layer 3 which is laminated on a surface of the sealing body, and the supporting body 2 which is laminated so as to sandwich the separating layer 3. Moreover, although not illustrated, when the separating layer 3 is made of a material that does not have an adhesive property as described earlier, other examples of the laminated body S include a laminated structure in which an adhesion layer (not illustrated) made of an adhesive is provided between the separating layer 3 and the plurality of semiconductor elements Sc or the sealing material Sr to become the side of the workpiece 1. In the laminated structure, the separating layer 3 and the plurality of semiconductor elements Sc or the sealing material Sr to become the side of the workpiece 1 are detachably bonded to each other by the adhesion layer.

In addition, the sealing body equipped with the plurality of semiconductor elements Sc is eventually cut in the XY directions by dicing or the like and subsequently subjected to a final process of attaching an electrode extracting part via a rewiring layer or the like to manufacture a plurality of electronic parts which are final products.

The holding member 10 is made of a metallic platen or the like that is a rigid body thick enough to prevent deformation by distortion (deflection) and is formed in a thick approximately rectangular or circular shape of which external dimensions are larger than those of the laminated body S, and a holding chuck 11 of the workpiece 1 is provided on a holding face which opposes the laminated body S in the Z direction.

The holding chuck 11 immovably and detachably holds the workpiece 1 by coming into contact with the workpiece 1 and is entirely or partially formed on the holding face which opposes the laminated body S in the Z direction.

As a specific example of the holding chuck 11, an adsorption chuck which adsorbs and holds the workpiece 1 using differential pressure created by suction is preferably used. In particular, among adsorption chucks, a porous chuck which adsorbs the workpiece 1 using differential pressure with an adsorption face made of a porous material is preferably used. In the case of a porous chuck, since adsorption by differential pressure can be performed without causing a partial deflection of the entire workpiece 1, a uniform holding state can be maintained.

In addition, as another example of the holding chuck 11, an adhesive chuck or an electrostatic chuck can be used in place of an adsorption chuck or a plurality can be used in combination among an adsorption chuck, an adhesive chuck, and an electrostatic chuck.

Moreover, although not illustrated, other examples of the holding member 10 include a structure which fixes (immovably and detachably holds) the entire laminated body S via the workpiece 1 with a plurality of support pins instead of a flat plate-shaped holding face and a honeycomb platen structure. In the case of the structure which fixes the workpiece 1 using pins, the structure is preferably configured such that the workpiece 1 can be adsorbed and fixed with tips of a part of or all of the plurality of support pins.

The laser irradiation part 22 is provided as a part of the optical system 20 which guides the laser beam L from the laser source 21 such as a laser oscillator toward a laser irradiation position P to be a target and is arranged so as to oppose the laminated body S being held by the holding member 10 in the Z direction. The laser irradiation part 22 has a scanning (sweeping) function for moving the laser beam L, being guided by the optical system 20, in the XY directions along the laminated body S. Accordingly, the laser beam L guided by the optical system 20 irradiates an entire face of the separating layer 3 by passing through the workpiece 1 or the supporting body 2 of the laminated body S.

As the laser beam L which irradiates the laminated body S from the laser irradiation part 22, a laser with a wavelength which passes through the workpiece 1 or the supporting body 2 and which can be absorbed by the separating layer 3 is preferably used.

More specifically, among the laser beam L, a laser beam L of which projected geometry is a spot (dot) shape which enables a high-output laser to be readily obtained is more preferable than a laser beam L of which the projected geometry is a line (slit) shape. A pulse-oscillated laser beam (pulse laser beam) L is more preferable than a continuously-oscillated laser (a continuous-wave laser) since an effect of heat created by laser energy absorbed in the separating layer 3 can be suppressed and, at the same time, high energy can be imparted inside the separating layer 3.

In other words, the laser irradiation part 22 is preferably configured so as to include laser sweeping means (a laser scanner) 22a for moving an optical axis (a principal axis) L1 of the spot like laser beam L having been generated by the laser source 21 so that a laser beam L is scanned (swept) in the XY directions with respect to the laminated body S by the laser scanner 22a. Therefore, even with only the laser scanner 22a, the laser beam L can be relatively moved with respect to the separating layer 3 of the laminated body S.

As shown in FIG. 1 or FIG. 3 to FIG. 12, the laser irradiation part 22 preferably has the laser scanner 22a which moves the optical axis L1 of the spot like laser beam L having been generated by the laser source 21 along the laminated body S and a lens 22b which guides the laser beam L from the laser scanner 22a toward the separating layer 3.

As the laser scanner 22a, preferably, a rotatably provided polygon scanner 22a1, Galvano scanner 22a2, or the like is used to sweep the laser beam L in one of the XY directions or both the XY directions which intersect a laser irradiation direction (Z direction) being oriented from the laser scanner 22a toward the separating layer 3.

The lens 22b has a function for collecting the laser beam L from the laser scanner 22a and an fθ lens that is used in combination with the polygon scanner 22a1, the Galvano scanner 22a2, or the like is preferably used. The fθ lens makes a scanning speed constant at a central part of the lens or a peripheral part thereof and enables a focal point to be placed on a single plane.

In addition, as the lens 22b, a telecentric lens 22b1 of which a main light beam L2 can be arranged parallel to the optical axis L1 which passes the center of the lens and which is perpendicular to the lens face or a non-telecentric lens 22b2 of which the main light beam L2 can be arranged at various angles with respect to the optical axis L1 is preferably used.

In particular, in the case of the non-telecentric lens 22b2, preferably, a lens central part (the center of the lens and a peripheral part thereof) at which irradiation of the laser beam L stabilizes is mainly used and an outer circumferential end of the lens where irradiation of the laser beam L is unstable is not used.

Figure 5:
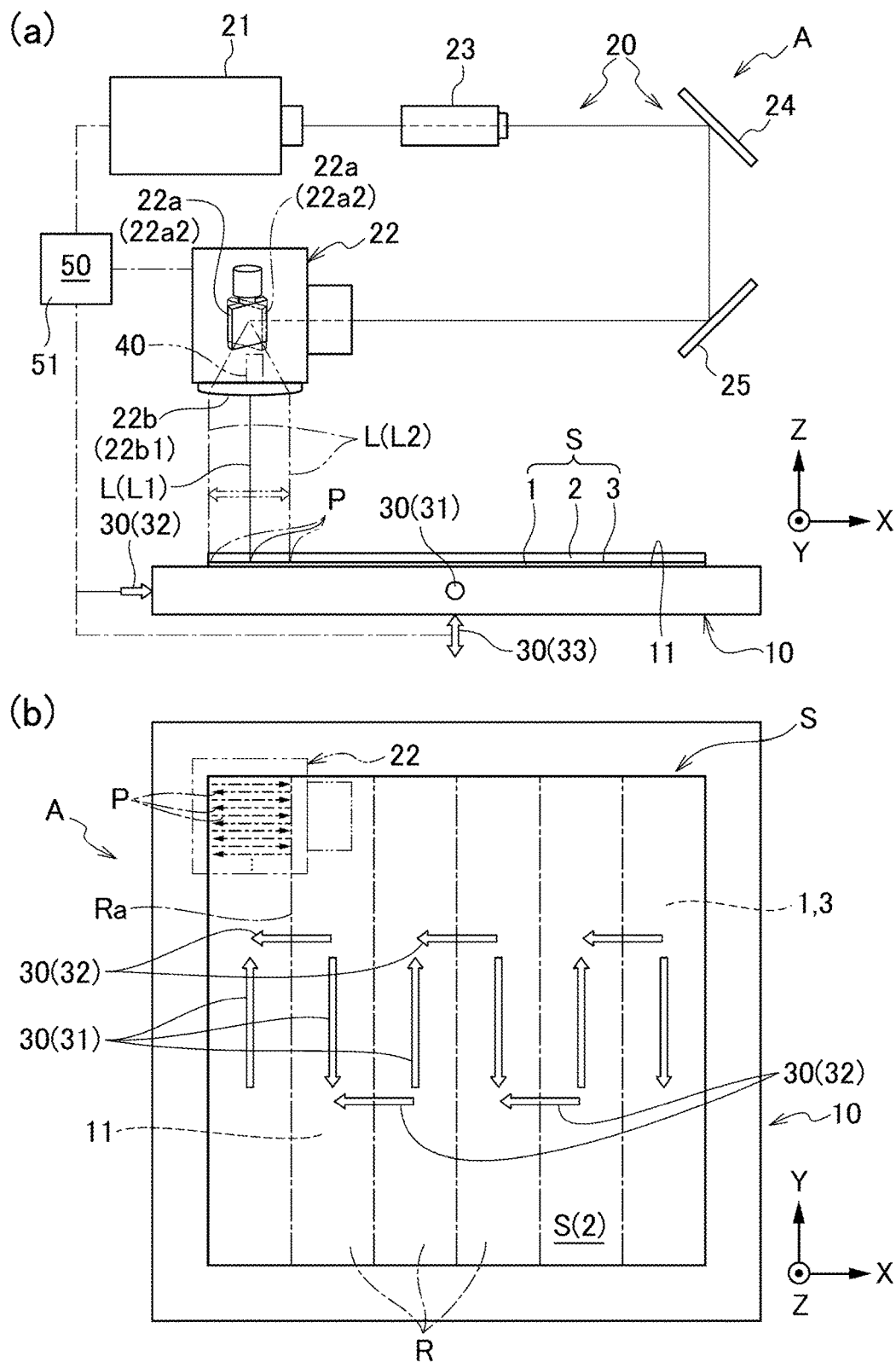
FIG. 5 is an explanatory diagram showing a modification of the workpiece-separating device according to the embodiment of the present invention in which FIG. 5 at (a) is a front view and FIG. 5 at (b) is a lateral plan view of the same.
Figure 10:
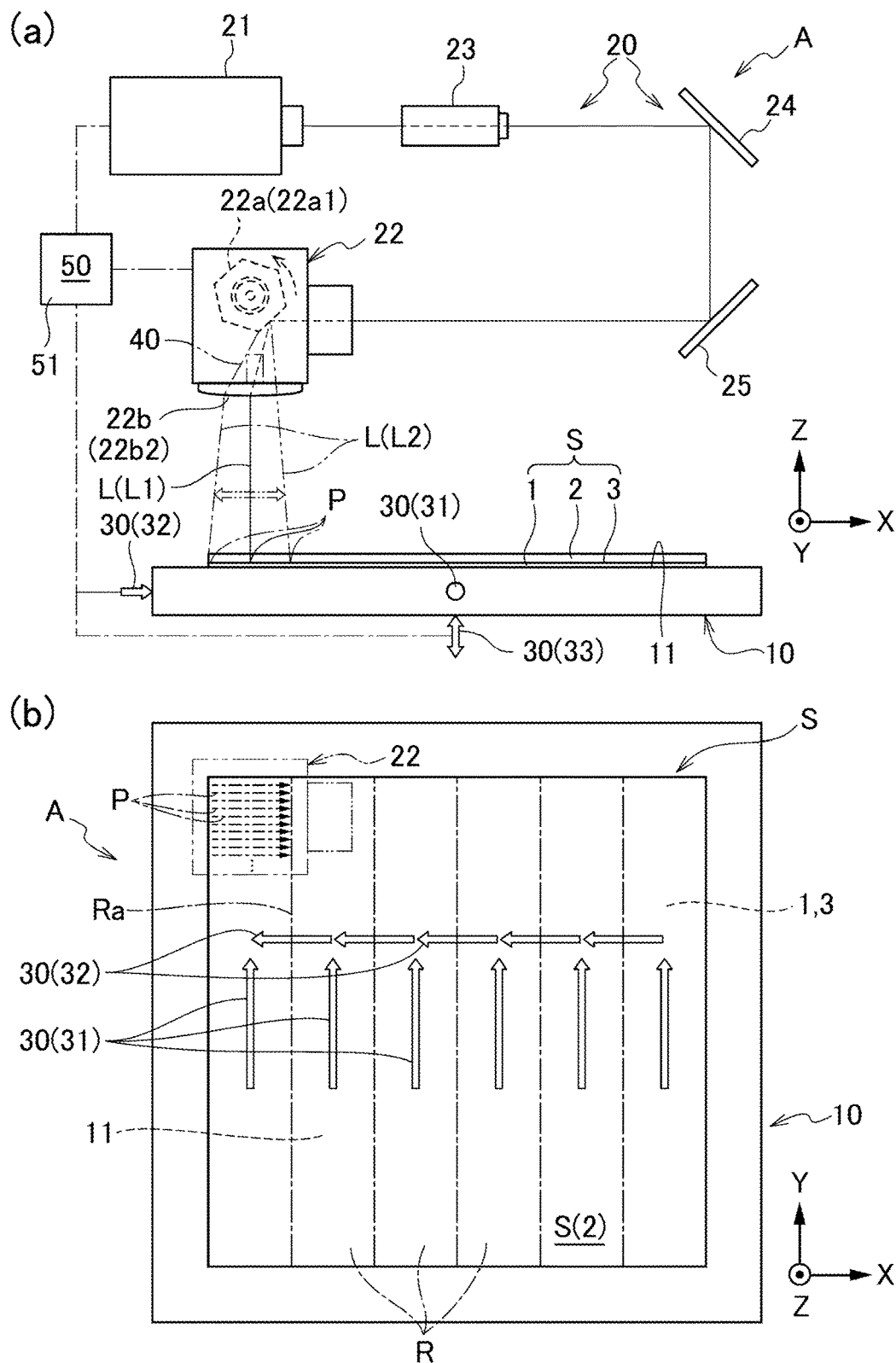
FIG. 10 is an explanatory diagram showing a modification of the workpiece-separating device according to the embodiment of the present invention in which FIG. 10 at (a) is a front view and FIG. 10 at (b) is a lateral plan view of the same.

In the case of the optical system 20 and the laser irradiation part 22 shown in FIG. 1 at (a), FIG. 5 at (a), FIG. 10 at (a), or the like as a specific example thereof, first, a beam diameter of the laser beam L generated by a laser oscillator to be the laser source 21 is adjusted by passing the laser beam L through a beam expander 23. Next, a direction of the laser beam L is changed by reflecting mirrors 24 and 25 such as steering mirrors to guide the laser beam L to the laser scanner 22*a* to be the laser irradiation part 22. Finally, the ultrashort pulsed-laser beam L is sequentially irradiated and swept from the laser scanner 22*a* through the lens 22*b* with respect to a target position of the laminated body S being held by the holding member 10.

Figure 3:
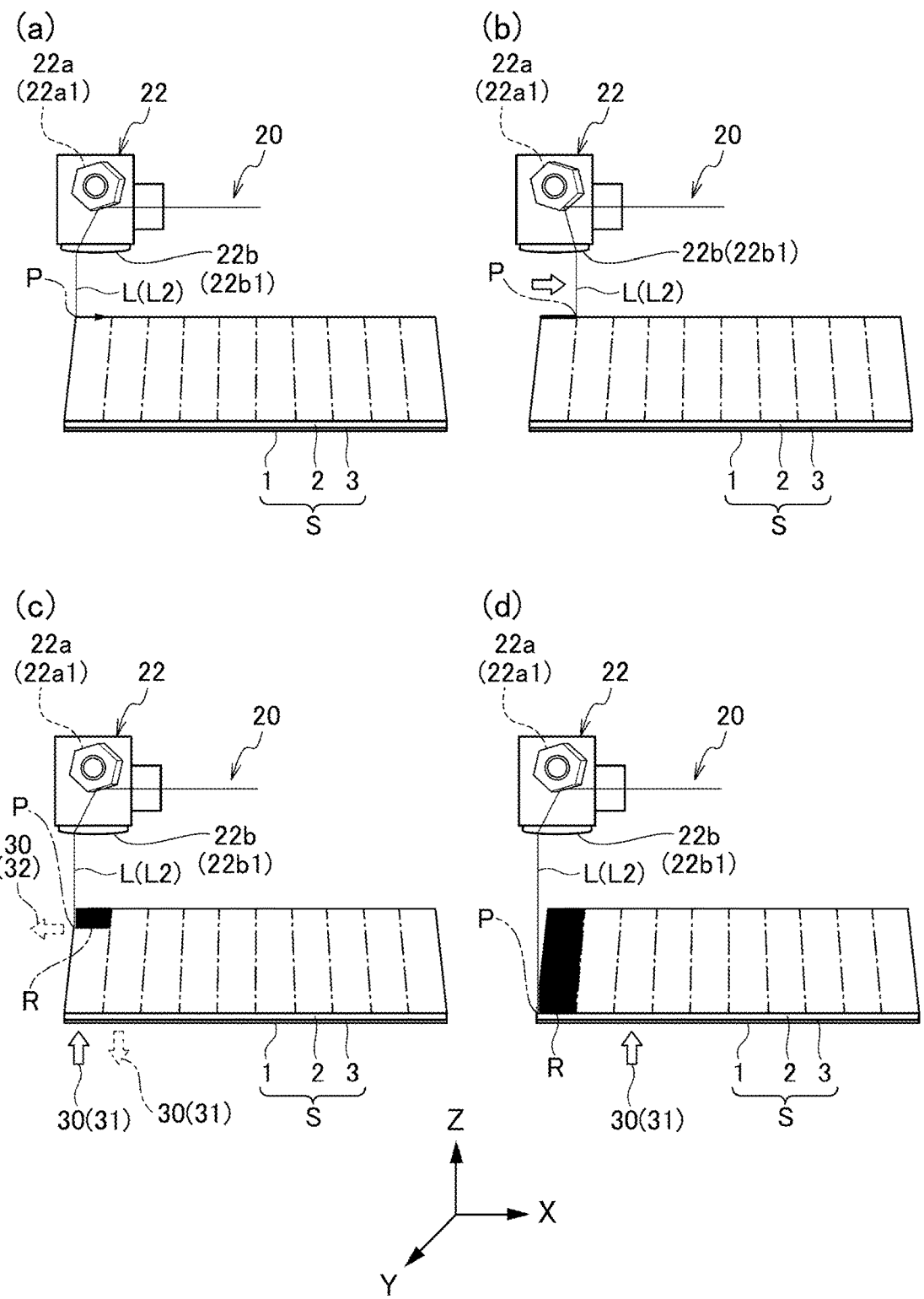
FIG. 3 is an explanatory diagram showing a workpiece-separating method in which FIG. 3 at (a) to FIG. 3 at (d) are partial cutout perspective views showing a laser irradiation process from a laser irradiation part.

In the case of the laser scanner 22*a* and the lens 22*b* shown in FIG. 1 at (a), FIG. 3 at (a) to FIG. 3 at (d), FIG. 4 at (a) to FIG. 4 at (d), and FIG. 9 at (a) and FIG. 9 at (b) as an example thereof, the polygon scanner 22*a*1 is used as the laser scanner 22*a* and the polygon scanner 22*a*1 has a mirror part being arranged in an N-sided regular polygon around a rotationally driven cylindrical body. As the lens 22*b*, the telecentric lens (the telecentric fθ lens) 22*b*1 is used.

The laser beam L incident toward the polygon scanner 22*a*1 strikes and reflects off the mirror part, passes through the lens 22*b*, and is converted into an optical path which is approximately perpendicular relative to the laminated body S or an optical path with a predetermined angle. A sweep direction due to rotational driving of the mirror part of the polygon scanner 22*a*1 is only one of the XY directions. In the illustrated example, the laser beam L is moved only by a predetermined width in one linear direction that is parallel to a laser incidence direction (X direction) with respect to the N-sided regular polygon mirror part. Although not illustrated as other examples, the laser beam L can also be reciprocated in both directions.

In the case of the laser scanner 22*a* shown in FIG. 5 as another example thereof, the Galvano scanner 22*a*2 is used as the laser scanner 22*a* and the Galvano scanner 22*a*2 has a rotationally driven reflecting mirror (a Galvano mirror). As the lens 22*b*, the telecentric lens (the telecentric fθ lens) 22*b*1 is used.

A sweep direction due to rotational driving of the reflecting mirror of the Galvano scanner 22*a*2 is only one of the XY directions. In the illustrated example, the laser beam L is reciprocated by a predetermined width in both linear directions that are parallel to the laser incidence direction (X direction). Although not illustrated as another example, the laser beam L can also be moved only in one direction.

Figure 6:
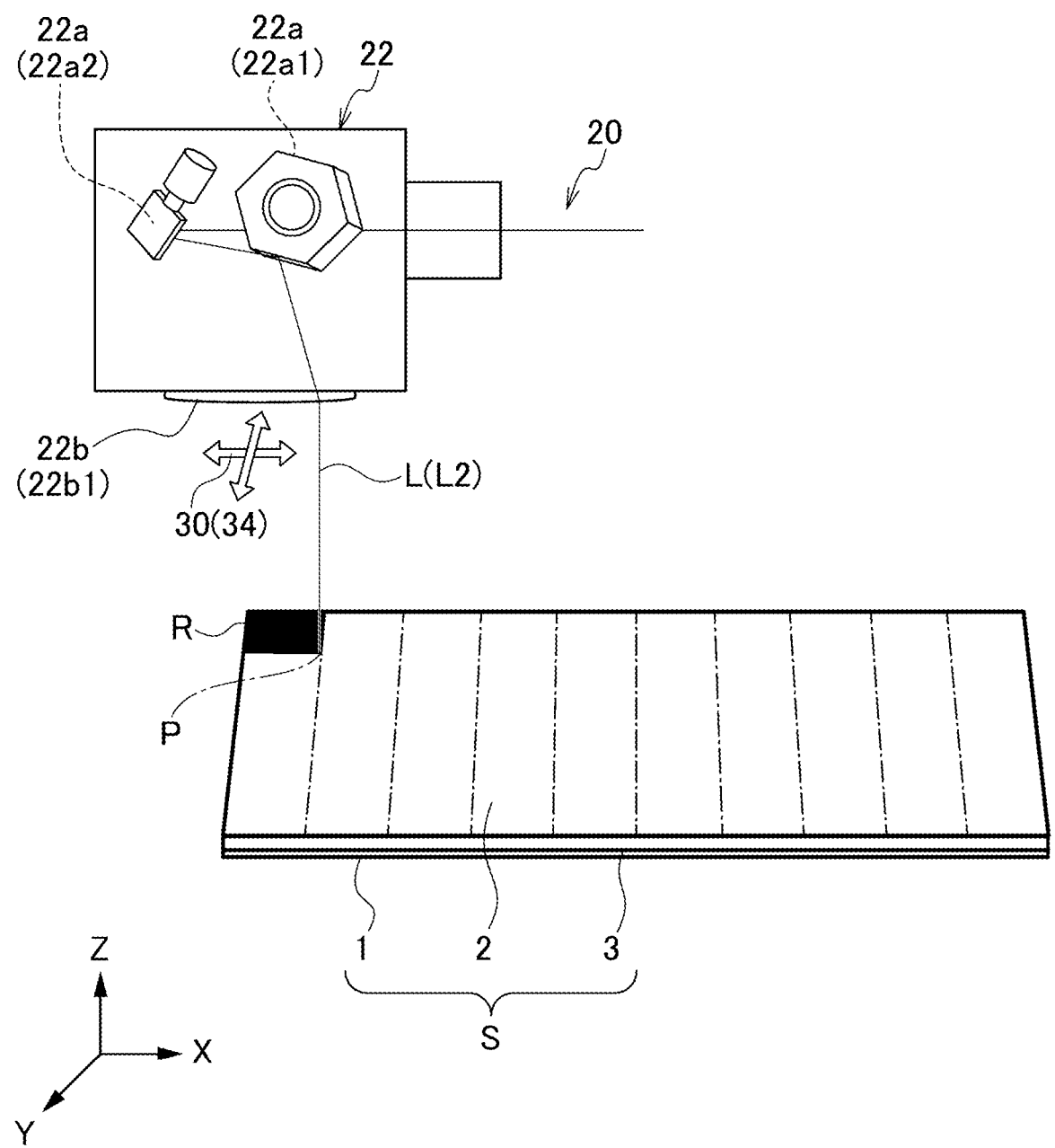
FIG. 6 is an explanatory diagram showing a modification of the laser irradiation part which is a partial cutout enlarged perspective view showing a laser irradiation process from a scanner.

The case shown in FIG. 6 is a combination of the polygon scanner 22*a*1 and the Galvano scanner 22*a*2 and the telecentric lens (the telecentric fθ lens) 22*b*1 is used. Sweep directions due to rotational driving of the mirror part of the polygon scanner 22*a*1 and rotational driving of the reflecting mirror of the Galvano scanner 22*a*2 are both XY directions.

Figure 7:
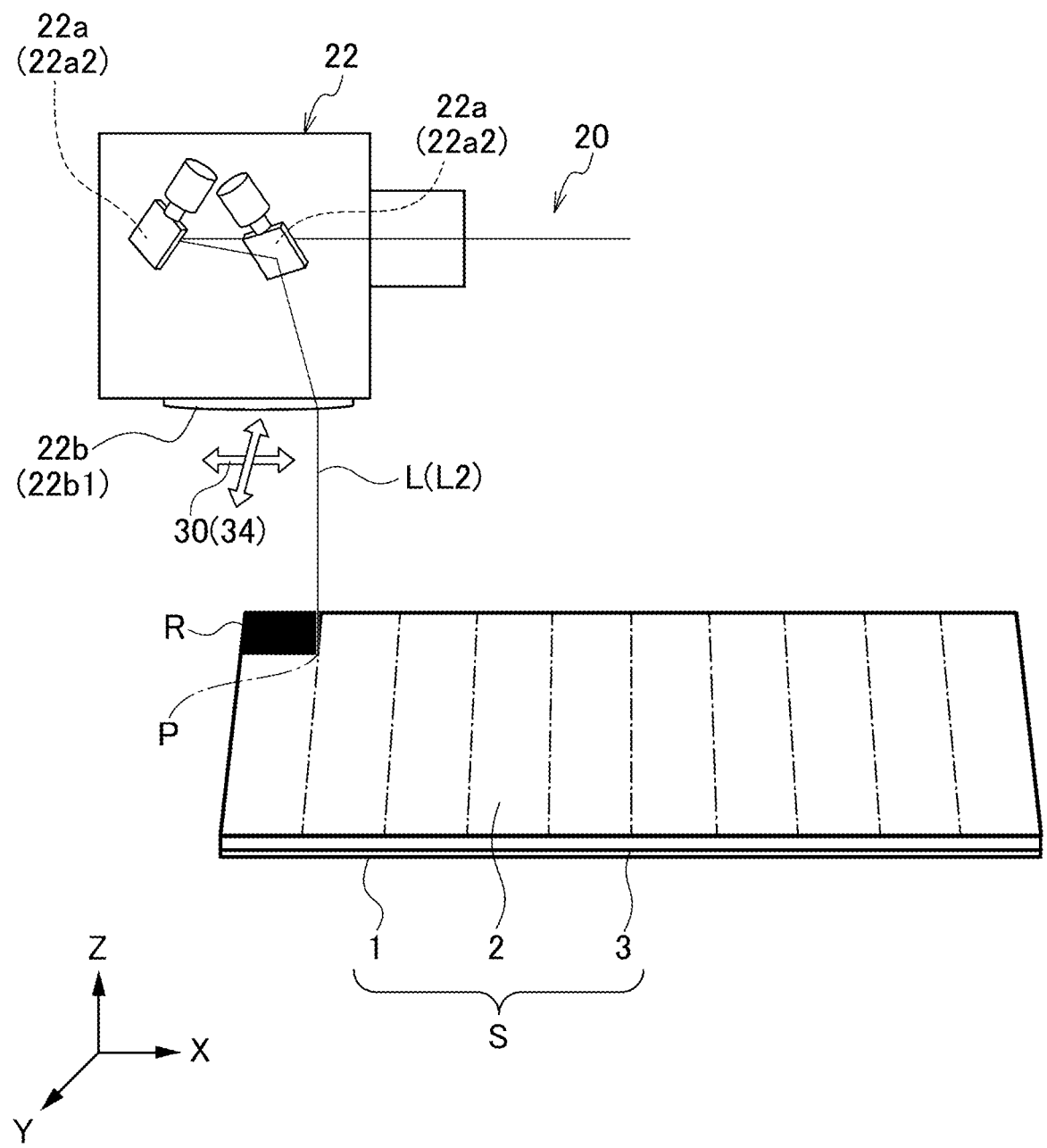
FIG. 7 is an explanatory diagram showing a modification of the laser irradiation part which is a partial cutout enlarged perspective view showing a laser irradiation process from a scanner.

Furthermore, the case shown in FIG. 7 as another example of the laser scanner 22*a* is constituted of a plurality of Galvano scanners 22*a*2 and the telecentric lens (the telecentric fθ lens) 22*b*1 is used. Sweep directions due to rotational driving of reflecting mirrors of the plurality of Galvano scanners 22*a*2 are both XY directions.

Furthermore, in the case shown in FIG. 10 at (a) and FIG. 11 at (a) and FIG. 11 at (b) as another example of the laser scanner 22*a* and the lens 22*b*, the polygon scanner 22*a*1 is used as the laser scanner 22*a* and the non-telecentric lens (the non-telecentric fθ lens) 22*b*2 is used as the lens 22*b*.

Although not illustrated as other modifications, a laser scanner with a structure which differs from the polygon scanner 22*a*1 and the Galvano scanner 22*a*2 can be used as the laser scanner 22*a* to change the sweep direction to one of the XY directions or to both XY directions.

In addition, a beam profile of a Gaussian beam which is pulse-oscillated as a laser beam from a laser oscillator to be the laser source 21 can be changed to an approximately quadrangular top-hat beam. Unlike an "edge part LE that gradually spreads in a circumferential direction in a cross section of the laser beams L1 and L2 formed in an approximately trapezoidal shape" being described in paragraph [0017] and FIG. 4 and FIG. 5 of Japanese Patent Application Laid-open No. 2012-024783, an approximately quadrangular top-hat beam refers to a beam profile of which an inclination angle of an edge part that spreads in a circumferential direction is approximately perpendicular (virtually perpendicular).

In other words, the laser irradiation part 22 can have an optical component for conversion (not illustrated) for changing a spot like Gaussian beam which is pulse-oscillated as the laser beam L from the laser source 21 (a laser oscillator) to a spot like top-hat beam of which an inclination angle of an edge part is approximately perpendicular. Accordingly, compared to the "edge part LE of the approximately trapezoidal laser beams L1 and L2" described in Japanese Patent Application Laid-open No. 2012-024783, an overlapping area (a laser superposition area) which is equal to or less than a decomposition threshold in edge parts of adjacent top-hat beams becomes narrower.

As the optical component for conversion, a beam shaper constituted of an aspheric lens or a beam shaper constituted of a diffraction optical element (DOE) is used.

Specific examples of a beam shaper constituted of an aspheric lens include a combination of an intensity conversion lens and a phase compensation lens.

Specific examples of a beam shaper constituted of a diffraction optical element (DOE) include a combination of a DOE and a condenser lens (fθ lens).

In particular, when using a diffraction optical element (DOE), a cross sectional shape (a uniform intensity distribution shape) of the top-hat beam can be changed from a circular or approximately circular shape to a rectangular shape (quadrilaterals with right-angled corners including a square and a rectangle). In other words, a laser irradiation shape with respect to the separating layer 3 can be changed to a rectangular shape.

There is a limit to a range of the laminated body S that can be irradiated by the laser beam L and, in the case of the laminated body S with a relatively large area, it is difficult to simultaneously irradiate the entire separating layer 3 with the laser beam L from the laser irradiation part 22.

In addition, in order to peel the supporting body 2 away from the workpiece 1 in a reliable manner, the entire face of the separating layer 3 must be uniformly decomposed and properties of the separating layer 3 must be changed to a peelable level using an energy amount (energy density) of the laser beam L irradiating the separating layer 3 from the laser irradiation part 22. The energy amount necessary for decomposition and changing properties also differs depending on a material of the separating layer 3.

Under such circumstances, for example, as described in Japanese Patent Application Laid-open No. 2012-024783, conceivably, the entirety of the separating layer 3 can be divided into a plurality of areas and each of the divided areas can be irradiated once (one shot) by the laser beam L from the laser irradiation part 22.

However, simply dividing the entire separating layer 3 into a plurality of irradiation areas does not prevent a size of each irradiation area from being excessively large, and since the laser beam L cannot be sufficiently focused on each irradiation area, the energy amount (energy density) of the laser beam L irradiating each irradiation area sometimes fail to reach a level necessary for causing the entire face of the separating layer 3 to uniformly decompose. Depending on the material of the separating layer 3, the entire face of each irradiation area cannot be uniformly decomposed and properties cannot be changed to a peelable level and, accordingly, a peeling irregularity occurs.

Therefore, in order to solve such problems, as shown in FIG. 1 to FIG. 12, the workpiece-separating device A and the workpiece-separating method according to the embodiment of the present invention divide an entirety of the laminated body S (the separating layer 3) into a plurality of irradiation areas and performs an aligned irradiation of a spot like laser beam L with respect to the plurality of irradiation areas from the laser scanner 22a of the laser irradiation part 22.

Figure 2:
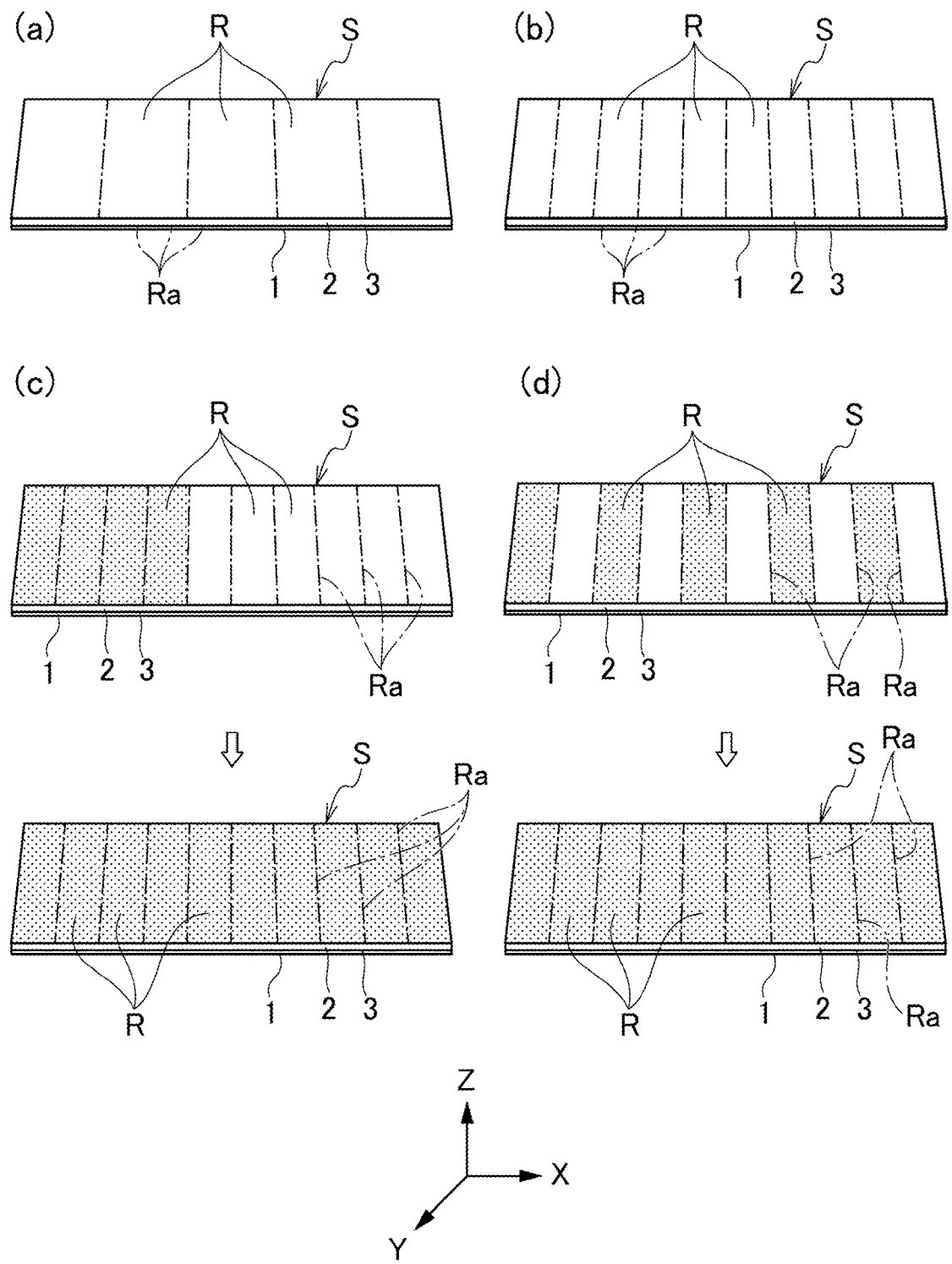
FIG. 2 is an explanatory diagram showing an irradiation area of a separating layer in which FIG. 2 at (a) and FIG. 2 at (b) are perspective views showing a difference in sizes among a plurality of irradiation areas and FIG. 2 at (c) and FIG. 2 at (d) are perspective views showing a difference in orders of irradiation with respect to a plurality of irradiation areas.

In other words, as shown in FIG. 2 at (a) and FIG. 2 at (b) and the like, an area of the laser beam L irradiated from the laser scanner 22a of the laser irradiation part 22 toward the separating layer 3 of the laminated body S being held by the holding member 10 divides an entire irradiated face of the separating layer 3 into a plurality of irradiation areas R and, with respect to the plurality of irradiation areas R, an aligned irradiation of the spot like laser beam L is performed for each irradiation area R (each unit irradiation area) from the laser scanner 22a.

More specifically, the plurality of irradiation areas R are divided such that an area thereof is smaller than an overall area of the separating layer 3 of the laminated body S and a shape of each divided irradiation area R is made in a rectangular shape. In particular, as illustrated, the shape of each irradiation area R is preferably made in a band shape (rectangles excluding a square: right-angled quadrilaterals including rectangles) which is elongated in one of the XY directions. A division direction (alignment direction) of the plurality of irradiation areas R is aligned in the same X direction or Y direction as a movement direction of the laser beam L (the optical axis L1) by the laser scanner 22a or a direction of relative movement by the driving part 30 to be described later. In the illustrated example, the entirety of the separating layer 3 is divided at predetermined intervals (regular intervals) in the X direction so that long sides of the plurality of irradiation areas R are disposed so as to extend in the Y direction and short sides of the plurality of irradiation areas R are disposed so as to extend in the X direction. As shown in FIG. 2 at (a) and FIG. 2 at (b) and the like, the size of the plurality of irradiation areas R is preferably set so as to be adjustable by the controlling part 50 to be described later.

An order of laser irradiation of the laser beam L from the laser irradiation part 22 with respect to the plurality of irradiation areas R is preferably also set so as to be adjustable by the controlling part 50 to be described later and, as shown in FIG. 2 at (c) and FIG. 2 at (d), FIG. 3 at (a) to FIG. 3 at (d), FIG. 4 at (a) to FIG. 4 at (d), or the like, the laser beam L preferably irradiates an entire face of each irradiation area R in an arbitrarily set order.

In the cases shown in FIG. 1 at (a) and FIG. 1 at (b), FIG. 10 at (a) and FIG. 10 at (b), and the like as specific examples of laser irradiation by the laser scanner 22a, due to an operation of the polygon scanner 22a1, the spot like laser beam L is irradiated so as to pass through the telecentric lens (telecentric fθ lens) 22b1 or the non-telecentric lens (non-telecentric fθ lens) 22b2 to be the lens 22b and to sequentially move in only one X direction or reciprocate in both X directions by a predetermined width toward the plurality of irradiation areas R.

In the case shown in FIG. 5, due to an operation of the Galvano scanner 22a2, the spot like laser beam L is irradiated so as to pass through the telecentric lens (telecentric fθ lens) 22b1 and to sequentially reciprocate in both X directions or move in only one X direction by a predetermined width toward the plurality of irradiation areas R.

In the case shown in FIG. 6, due to operations of the polygon scanner 22a1 and the Galvano scanner 22a2, the spot like laser beam L is irradiated so as to pass through the telecentric lens (telecentric fθ lens) 22b1 to be the lens 22b and to sequentially reciprocate in both X directions or move in only one X direction by a predetermined width toward the plurality of irradiation areas R and, at the same time, also similarly move in the Y direction.

In the case shown in FIG. 7, due to operations of a plurality of Galvano scanners 22a2, the spot like laser beam L is irradiated so as to pass through the telecentric lens (telecentric fθ lens) 22b1 to be the lens 22b and to sequentially reciprocate in both X directions or move in only one X direction by a predetermined width toward the plurality of irradiation areas R and, at the same time, also similarly move in the Y direction.

It should be noted that, in the illustrated examples, as a shape of the plurality of divided irradiation areas R, the entirety of the separating layer 3 is divided into band shapes along an entire length of the Y direction. In addition, although not illustrated as another example, the entirety of the separating layer 3 can also be divided in plurality in the Y direction to change the shape of the plurality of divided irradiation areas R into an approximately square shape.

As shown in FIG. 1 at (a) and FIG. 3 at (a) to FIG. 3 at (d) or FIG. 4 at (a) to FIG. 4 at (d) and FIG. 9 at (a) and FIG. 9 at (b), an irradiation angle of the laser beam L which irradiates the laminated body S from the laser scanner 22a of the laser irradiation part 22 is preferably set approximately perpendicular with respect to the supporting body 2 or the separating layer 3 of the laminated body S being held by the holding member 10.

"Approximately perpendicular" as used herein is not limited to 90 degrees with respect to a surface of the supporting body 2 or the separating layer 3 and also includes angles representing an increase or decrease by several degrees from 90 degrees.

In addition, as another example, as shown in FIG. 10 at (a) and FIG. 11 at (a) and FIG. 11 at (b), the irradiation angle of the laser beam L can be set to a predetermined angle with respect to the supporting body 2 or the separating layer 3 of the laminated body S being held by the holding member 10.

With the spot like laser beam L that irradiates the plurality of irradiation areas R in the separating layer 3 of the laminated body S from the laser scanner 22a of the laser irradiation part 22, a beam shape (cross sectional shape) of each laser beam L is a circular shape, an approximately circular shape, or a rectangular shape.

Figure 8:
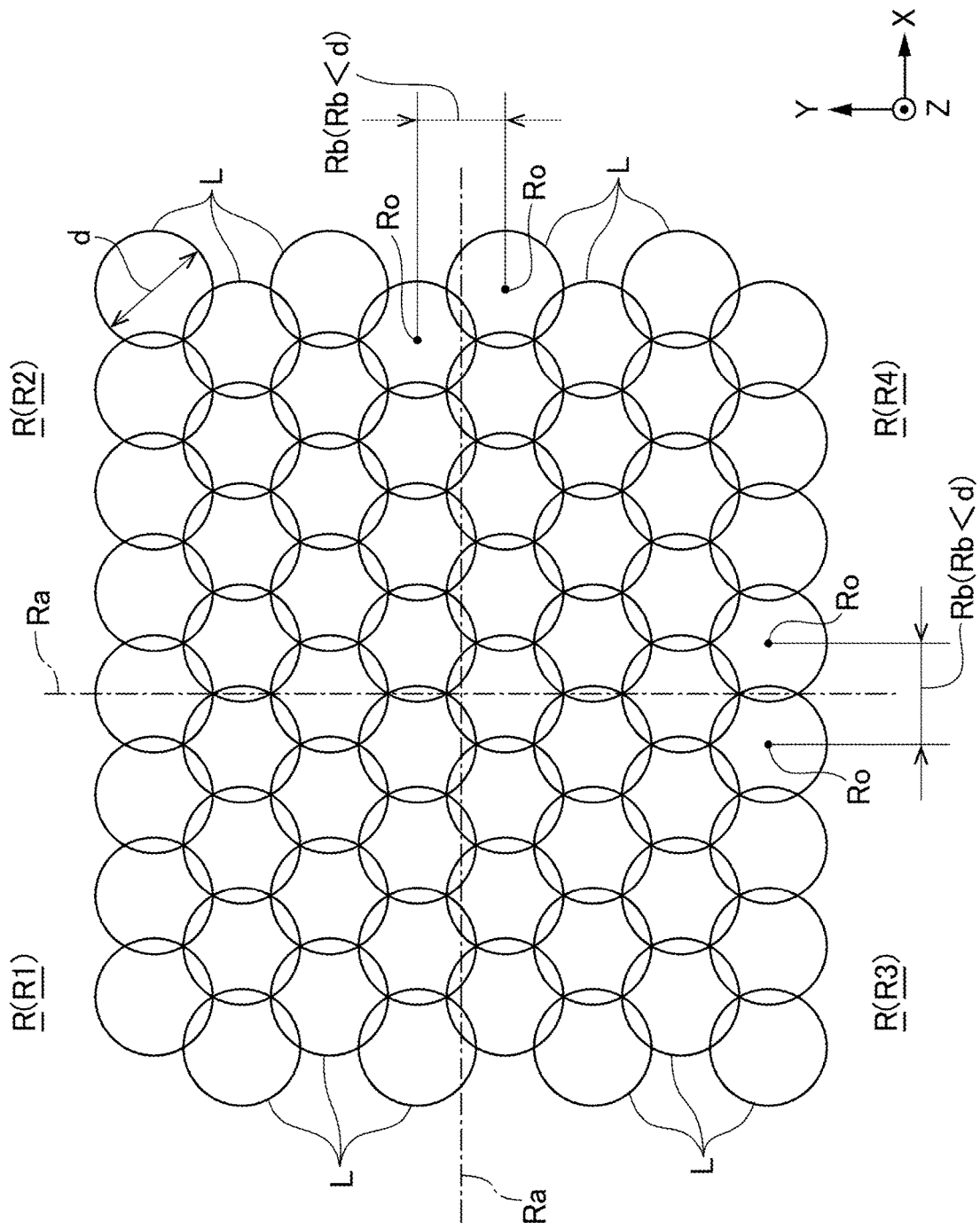
FIG. 8 is a plan view partially enlarging a boundary between a plurality of irradiation areas.

In the case shown in FIG. 8, the beam shape is a same circular shape as a cross sectional shape of a Gaussian beam.

In addition, although not illustrated as another example, the beam shape can also be changed to a rectangular shape (a square or a rectangle).

Furthermore, as shown in FIG. 8, an aligned irradiation of the laser beam L is preferably sequentially performed with respect to each irradiation area R so that respective laser beams L are aligned in the X direction and the Y direction by the driving part 30 to be described later so that parts of the laser beams L overlap with each other. In this case, an entirety of one irradiation area R among the plurality of irradiation areas R is filled by a large number of spot like laser beams L in a gapless manner. After the entirety of the one irradiation area R is filled by a large number of spot like laser beams L, an aligned irradiation of spot like laser beams L with respect to the next irradiation area R is similarly repetitively performed. Eventually, an aligned irradiation is performed on all of the plurality of irradiation areas R.

In addition, as shown in FIG. 8, the spot like laser beams L of which an aligned irradiation is performed across a boundary Ra of the plurality of irradiation areas R is preferably subjected to an aligned irradiation so that respective ends of the spot like laser beams L arranged on opposite sides of the boundary Ra come into contact with each other. An interval Rb of the spot like laser beams L of which an aligned irradiation is performed across the boundary Ra of the plurality of irradiation areas R is preferably set smaller than a beam diameter d of the laser beams L.

The boundary Ra of the plurality of irradiation areas R refers to a boundary line formed between adjacent irradiation areas R1, R2, R3, and R4 which are aligned in the X direction and the Y direction. The interval Rb of the boundary Ra refers to a distance between beam centers Ro in the spot like laser beams L of which an aligned irradiation is performed across the boundary Ra. Accordingly, the entireties of the irradiation areas R1, R2, R3, and R4 are all filled with a large number of the spot like laser beams L and the boundaries Ra of the irradiation areas R1, R2, R3, and R4 are also filled with a large number of the spot like laser beams L.

In the case of the illustrated example, the intervals Rb of the spot like laser beams L of which an aligned irradiation is performed across the boundary Ra are set so as to have same dimensions in the X direction and the Y direction as the intervals of the spot like laser beams L of which an aligned irradiation is performed on the irradiation areas R1, R2, R3, and R4 and that parts of the respective laser beams L similarly overlap with each other.

In addition, although not illustrated as another example, the intervals Rb of the spot like laser beams L of which an aligned irradiation is performed across the boundary Ra can be changed to a setting other than the illustrated example such as intervals that differ from the intervals of the spot like laser beams L of which an aligned irradiation is performed on the irradiation areas R1, R2, R3, and R4.

Furthermore, with the spot like laser beam L that irradiates the laminated body S from the laser scanner 22a of the laser irradiation part 22, a beam shape (cross sectional shape) of each laser beam L changes from a circular shape to an elliptic shape in accordance with the irradiation angle of the laser beam L with respect to the laminated body S.

In other words, in a state where the laser beam L irradiates the laminated body S through the lens 22b from the laser scanner 22a, when the irradiation angle of the spot like laser beam L with respect to the laminated body S is approximately perpendicular (approximately 90 degrees), as shown in FIG. 8, the beam shape of each laser beam L is a circular shape and the beam diameters d of the respective laser beams L are all equal to each other.

By contrast, when the spot like laser beam L irradiating the laminated body S through the lens 22b from the laser scanner 22a is inclined, the irradiation angle with respect to the laminated body S becomes less than approximately perpendicular (approximately 90 degrees) and a laser irradiation distance from the laser scanner 22a to the laminated body S changes. In the case of the inclination, the beam shape of each laser beam L becomes an elliptic shape and, at the same time, the beam diameter d of each laser beam L changes. The beam shape of the spot like laser beam L is preferably a circular shape rather than an elliptic shape which represents an unstable beam shape.

This is because in a case where the irradiation angle with respect to the laminated body S from the laser scanner 22a inclines and becomes less than approximately perpendicular (approximately 90 degrees) or in a case of a warped laminated body S, the beam diameter d of the laser beam L changes due to a change in a laser irradiation distance from the laser scanner 22a to the laminated body S. Since irradiation energy itself from the laser scanner 22a to the laminated body S does not change, a change in the beam diameter d causes energy density of the laser beam L to change inversely with the square of the beam diameter d.

In other words, when the laser beam L is swept from the laser scanner 22a toward an entirety of an irradiation area of which a divided size is relatively large as described in, for example, Japanese Patent Application Laid-open No. 2012-024783, a swing angle of the laser scanner 22a accompanying the sweep widens to possibly cause a peeling irregularity due to a change in irradiation energy density between a center and an end of the irradiation area.

By contrast, restricting a swing angle of the laser scanner 22a accompanying the sweep to a compact angle towards an irradiation area of which a divided size is relatively small causes irradiation energy density to be uniform and enables an occurrence of a peeling irregularity to be prevented.

The driving part 30 is an optical axis relative moving mechanism configured such that, by moving either one of the holding member 10 and the laser irradiation part 22 (the laser scanner 22a) or both the holding member 10 and the laser irradiation part 22 (the laser scanner 22a), the laser beam L irradiated from the laser scanner 22a relatively moves in at least two directions (XY directions) which intersect the irradiation direction (Z direction) of the laser beam L from the laser irradiation part 22 with respect to the supporting body 2 and the separating layer 3 of the laminated body S being held by the holding member 10.

The directions of relative movement by the driving part 30 are not limited to the XY directions and, when necessary, also include the Z direction.

Examples of the optical axis relative moving mechanism to be the driving part 30 mainly include a workpiece-side moving type which moves the holding member 10 and the laminated body S and an optical axis-side moving type which moves the laser scanner 22a.

In the case of the workpiece-side moving type, as shown in FIG. 1 at (a) and FIG. 1 at (b), FIG. 5 at (a) and FIG. 5 at (b), FIG. 10 at (a) and FIG. 10 at (b), and the like, the holding member 10 is provided with the driving part 30 and by moving the holding member 10 in the X direction and the Y direction or the Z direction with the driving part 30, the laser irradiation position P from the laser scanner 22a is moved in the XY directions or the Z direction. As the driving part 30 in this case, an XY stage or an XY table having a Y-axis moving mechanism 31 and an X-axis moving mechanism 32 constituted of a motor shaft or the like is used. Furthermore, a Z-axis moving mechanism 33 which moves the holding member 10 in the Z direction is preferably provided when necessary.

Operations of the Y-axis moving mechanism 31, the X-axis moving mechanism 32, and the Z-axis moving mechanism 33 are controlled by the controlling part 50 to be described later and, in addition to scanning (sweeping) the laser beam L in the X direction by an operation of the laser scanner 22a, the holding member 10 and the laminated body S are moved in the XY directions or the Z direction.

Due to an operation of the Y-axis moving mechanism 31, the plurality of irradiation areas R divided into band shapes which are elongated in the Y direction or the like in the separating layer 3 of the laminated body S are sequentially moved only in one Y direction or reciprocated in both Y directions by a predetermined length (corresponding to one row of the irradiation areas R).

Due to an operation of the X-axis moving mechanism 32, the plurality of irradiation areas R divided into band shapes which are shortened in the X direction or the like in the separating layer 3 of the laminated body S are sequentially moved only in one X direction or reciprocated in both X directions by a predetermined width (corresponding to one row of the irradiation areas R).

Due to an operation of the Z-axis moving mechanism 33, the plurality of irradiation areas R are sequentially moved only in one Z direction or reciprocated in both Z directions by a predetermined height.

In the cases shown in FIG. 1 at (a) and FIG. 1 at (b) and FIG. 10 at (a) and FIG. 10 at (b) as specific examples of the workpiece-side moving type, each band-shaped irradiation area R which is elongated in the Y direction is sequentially moved by a Y-direction dimension of each irradiation area R by an operation of the Y-axis moving mechanism 31 in conjunction with scanning (sweeping) in the X direction of the laser beam L by an operation of the polygon scanner 22a1. After scanning with respect to one irradiation area R is completed, each band-shaped irradiation area R which is short in the X direction is sequentially moved by an X-direction dimension of each irradiation area R by an operation of the X-axis moving mechanism 32 and, subsequently, the operations described above are repeated.

In the illustrated example, scanning of the polygon scanner 22a1 is performed only during a movement in one direction of the Y-axis moving mechanism 31. In other words, every time the operation of the Y-axis moving mechanism 31 with respect to one irradiation area R is completed, scanning by the polygon scanner 22a1 is stopped and a movement in the X direction by the X-axis moving mechanism 32 toward the next irradiation area R and an opposite-direction movement in the Y direction by the Y-axis moving mechanism 31 are performed. Scanning by the polygon scanner 22a1 is restarted only after these operations are completed.

In the cases shown in FIG. 5 at (a) and FIG. 5 at (b), each band-shaped irradiation area R which is elongated in the Y direction is sequentially moved by a Y-direction dimension of each irradiation area R by an operation of the Y-axis moving mechanism 31 in conjunction with scanning (sweeping) in the X direction of the laser beam L by an operation of the Galvano scanner 22a2. After scanning with respect to one irradiation area R is completed, each band-shaped irradiation area R which is short in the X direction is sequentially moved by an X-direction dimension of each irradiation area R by an operation of the X-axis moving mechanism 32 and, subsequently, the operations described above are repeated.

In the illustrated example, scanning of the Galvano scanner 22a2 is performed during a movement in both directions of the Y-axis moving mechanism 31. In other words, in the illustrated example, every time the operation of the Y-axis moving mechanism 31 with respect to one irradiation area R is completed, a movement in the X direction by the X-axis moving mechanism 32 toward the next irradiation area R and an opposite-direction movement in the Y direction by the Y-axis moving mechanism 31 are performed without stopping the scanning by the Galvano scanner 22a2. Accordingly, the example shown in FIG. 5 at (a) and FIG. 5 at (b) enables scanning to be accelerated as compared to the examples shown in FIG. 1 at (a) and FIG. 1 at (b) and FIG. 10 at (a) and FIG. 10 at (b).

In addition, although not illustrated as other examples, changes can be made such as performing scanning of the Galvano scanner 22a2 only when the Y-axis moving mechanism 31 is moving in one direction or performing scanning of the polygon scanner 22a1 during a movement in both directions of the Y-axis moving mechanism 31.

In addition, in the case of the optical axis-side moving type, as shown in FIG. 6 and FIG. 7, a configuration is adopted in which the driving part 30 is provided in a part of the optical system 20 and the laser irradiation position P from the laser irradiation part 22 is moved in the XY directions or the Z direction without moving the holding member 10.

The driving part 30 in this case has an XY-axis moving mechanism 34 which is constituted of the polygon scanner 22a1, the Galvano scanner 22a2, or the like.

When the laser irradiation position P from the laser irradiation part 22 needs to be further relatively moved in the Z direction, although not illustrated, the holding member 10 is provided with the Z-axis moving mechanism 33 or the laser irradiation part 22 (the laser scanner 22a) is moved in the Z direction by the driving part 30.

The length measuring part 40 is constituted of a contactless displacement meter, a contactless displacement sensor, or the like which measures an irradiation distance from the laser irradiation part 22 to an irradiated face of the supporting body 2 or the separating layer 3 of the laminated body S being held by the holding member 10 and the length measuring part 40 is arranged so as to oppose, in the Z direction, the laminated body S being held by the holding member 10.

In the cases shown in FIG. 1 at (a) and FIG. 1 at (b), FIG. 9 at (a) and FIG. 9 at (b), FIG. 5 at (a) and FIG. 5 at (b), FIG. 10 at (a) and FIG. 10 at (b), FIG. 11 at (a) and FIG. 11 at (b), and the like as specific examples of the length measuring part 40, the laser irradiation part 22 (the laser scanner 22a) is provided with a laser displacement meter to be the length measuring part 40, a length in the Z direction from the laser irradiation part 22 (the laser scanner 22a) to the irradiated face of the separating layer 3 is measured, and a measured value thereof is output to the controlling part 50 to be described later.

In addition, although not illustrated as another example, a displacement meter or a displacement sensor other than a laser displacement meter can be used as the length measuring part 40.

The controlling part 50 is a controller which is respectively electrically connected to a drive source of the holding chuck 11 of the holding member 10, the optical system 20, the laser source 21 and the laser irradiation part 22, the optical axis moving mechanism to be the driving part 30, and the length measuring part 40.

Furthermore, the controlling part 50 is also a controller which is additionally electrically connected to a carrying-in mechanism (not illustrated) for carrying the laminated body S prior to separation toward the holding member 10, a peeling mechanism (not illustrated) which only holds and peels away the supporting body 2 from the laminated body S after laser irradiation, a carrying-out mechanism (not illustrated) for carrying the laminated body S (the workpiece 1) after peeling from the holding member 10, and the like.

The controller to be the controlling part 50 sequentially controls operations at a timing set in advance in accordance with a program set in advance in a control circuit thereof (not illustrated). In other words, the controlling part 50 not only performs overall operation control of the workpiece-separating device A including ON/OFF control of the laser beam L which irradiates the laser irradiation position P from the laser source 21 but also configures various settings such as settings of various parameters of the laser beam L.

Due to the controlling part 50, the laser irradiation part 22 (the laser scanner 22a) of the optical system 20 and the driving part 30 irradiate, with the laser beam L from the laser scanner 22a, each of a plurality of irradiation areas R created by dividing the supporting body 2 and the separating layer 3 of the laminated body S being held by the holding member 10 and perform control so that an irradiation angle of the laser beam L is approximately perpendicular to a surface of the supporting body 2 or the separating layer 3 or a predetermined angle is assumed.

In addition, the controller to be the controlling part 50 has input means 51 such as a touch panel and a display part (not illustrated) and is configured such that a scanning distance of the laser scanner 22a, a size of the plurality of irradiation areas R, an irradiation order of the laser beam L from the laser scanner 22a with respect to the plurality of irradiation areas R, and the like can be set by operations of the input means 51.

As shown in FIG. 2 at (a) and FIG. 2 at (b), according to an irradiation order of the laser beam L from the laser irradiation part 22 with respect to the plurality of irradiation areas R which is set to the controlling part 50, "continuous irradiation" or "discontinuous irradiation" is performed with respect to the plurality of irradiation areas R aligned in the X direction and the Y direction in conjunction with a relative movement in the XY directions due to the driving part 30 so that all of the plurality of irradiation areas R are eventually irradiated. In the drawings, a presence or absence of irradiation is indicated by shadings and the irradiation area R prior to irradiation is displayed in a light shade while the irradiation area R after irradiation is displayed in a dark shade.

In the case shown in FIG. 2 at (c) as "continuous irradiation", the irradiation area R irradiated first (immediately previously) and the irradiation area R to be irradiated next are irradiated in a continuous order for a plurality of rows arranged in the X direction from the band-shaped irradiation area R arranged on one side of the laminated body S, and every time irradiation of one row ends, other rows are similarly subjected to continuous irradiation.

In the case shown in FIG. 2 at (d) as "discontinuous irradiation", the irradiation area R irradiated first (immediately previously) and the irradiation area R to be irradiated next are irradiated in separate orders for a single row arranged in the X direction, and with the exception of other rows being similarly subjected to continuous irradiation every time irradiation of one row ends, irradiation is performed in a same manner as "continuous irradiation". In the illustrated example, every other irradiation area R in the X direction is irradiated so that irradiation areas R having been irradiated are not positioned adjacent to each other in the X direction.

Furthermore, although not illustrated as another example, the irradiation order can be changed to other than the illustrated examples such as performing "continuous irradiation" or "discontinuous irradiation" for each row arranged in the Y direction among the plurality of irradiation areas R or irradiating every plurality of (every third) irradiation areas R in "discontinuous irradiation".

In addition, the program set to the control circuit of the controlling part 50 will be explained as the workpiece-separating method using the workpiece-separating device A.

The workpiece-separating method using the workpiece-separating device A according to the embodiment of the present invention includes, as primary processes: a holding process of detachably holding one of the workpiece 1 and the supporting body 2 of the laminated body S with the holding member 10; and a laser irradiation process of irradiating the separating layer 3 with the laser beam L from the laser irradiation part 22 through the other of the supporting body 2 and the workpiece 1 of the laminated body S being held by the holding member 10.

In addition, as post-processes of the laser irradiation process, the workpiece-separating method preferably includes: a relative moving process of moving the laser irradiation position P from the laser irradiation part 22 with respect to the supporting body 2 and the separating layer 3 of the laminated body S being held by the holding member 10; and a separating process of peeling the supporting body 2 away from the workpiece 1 of the laminated body S.

Furthermore, as post-processes of the separating process, the workpiece-separating method preferably includes: a cleaning process of removing a residue of the separating layer 3 which remains on the workpiece 1 having been separated from the separating layer 3 with a cleaning liquid; and a disconnecting process of cutting the workpiece 1 after the cleaning process by dicing or the like.

In the holding process, due to an operation of a carrying-in mechanism (not illustrated) which is constituted of a carrying robot or the like, the laminated body S prior to separation is carried toward the holding member 10 and the laminated body S prior to separation is immovably held by the holding chuck 11 at a predetermined position on a holding face of the holding member 10.

In the laser irradiation process, due to operations of the optical system 20 and the laser irradiation part 22, the laser beam L irradiates the separating layer 3 through the supporting body 2 or the workpiece 1 toward the laminated body S being held by the holding member 10.

In the relative moving process, due to operations of the driving part 30 and the laser irradiation part 22 (the laser scanner 22a), the laminated body S being held by the holding member 10 and the laser scanner 22a are relatively moved in the XY directions or the Z direction.

In the cases shown in FIG. 1 to FIG. 5 and FIG. 9 to FIG. 11, due to operations of the driving part 30 (the Y-axis moving mechanism 31, the X-axis moving mechanism 32, and the Z-axis moving mechanism 33), the supporting body 2 and the separating layer 3 of the laminated body S being held by the holding member 10 are relatively moved in the XY directions with respect to the laser scanner 22a. In addition, in the cases shown in FIG. 6 or FIG. 7, due to an operation of the driving part 30 (the XY-axis moving mechanism 34) which is provided in a part of the optical system 20, the laser scanner 22a is relatively moved in the XY directions with respect to the supporting body 2 and the separating layer 3 of the laminated body S being held by the holding member 10. Accordingly, with respect to the plurality of irradiation areas R which are divided smaller than entire irradiated faces of the supporting body 2 and the separating layer 3, an aligned irradiation of the spot like laser beam L is performed for each irradiation area R from the laser scanner 22a. At the same time, an irradiation angle of the spot like laser beam L of which an aligned irradiation is performed for each irradiation area R from the laser scanner 22a is held so as to be approximately perpendicular or to assume a predetermined angle. Eventually, all of the plurality of irradiation areas R are irradiated by the laser beam L.

Accordingly, the laser beam L is irradiated evenly and uniformly for each unit irradiation area R. Therefore, the laser beam L eventually irradiates the entire face of the separating layer 3 without creating an irradiation irregularity and the entire face of the separating layer 3 changes properties so that the workpiece 1 and the supporting body 2 can be peeled away from each other.

In the separating process, due to an operation of the peeling mechanism (not illustrated) which holds and peels away the supporting body 2 with respect to the laminated body S after laser irradiation, the supporting body 2 is peeled away and separated from the workpiece 1 of the laminated body S being held by the holding member 10.

After the separating process, due to an operation of the carrying-in mechanism (not illustrated) constituted of a carrying robot or the like, the workpiece 1 after separation is detached from a holding face of the holding member 10 to be carried out.

Subsequently, the processes described above are repeated.

In addition, in the case of the warped laminated body S as shown in FIG. 9 at (a) and FIG. 9 at (b) and FIG. 11 at (a) and FIG. 11 at (b), when performing an aligned irradiation of the spot like laser beam L from the laser scanner 22a for each of the plurality of irradiation areas R, an operation of the Z-axis moving mechanism 33 is controlled based on a measured value by the length measuring part 40 so that irradiation distances from the laser scanner 22a to the plurality of irradiation areas R become approximately constant.

Specifically, as a control example, a representative point of each irradiation area R which opposes the laser scanner 22a in the Z direction is measured by the length measuring part 40 to detect a measured value at a time point prior to laser irradiation from the laser scanner 22a, and an operation of the Z-axis moving mechanism 33 is controlled based on the measured value so as to coincide with a timing at which the laser irradiation of each irradiation area R is to be performed. In other words, due to operation control of the Z-axis moving mechanism 33, the holding member 10 is moved in the Z direction and irradiation distances from the laser scanner 22a to the plurality of irradiation areas R are adjusted.

In addition, as another example, the holding member 10 can be moved in the Z direction by performing operation control of the Z-axis moving mechanism 33 while feeding back a measured value having been measured by the length measuring part 40.

Accordingly, an irradiation distance between the separating layer 3 of the warped laminated body S being held by the holding member 10 and the laser scanner 22a can be adjusted so as to be approximately constant.

Figure 12:
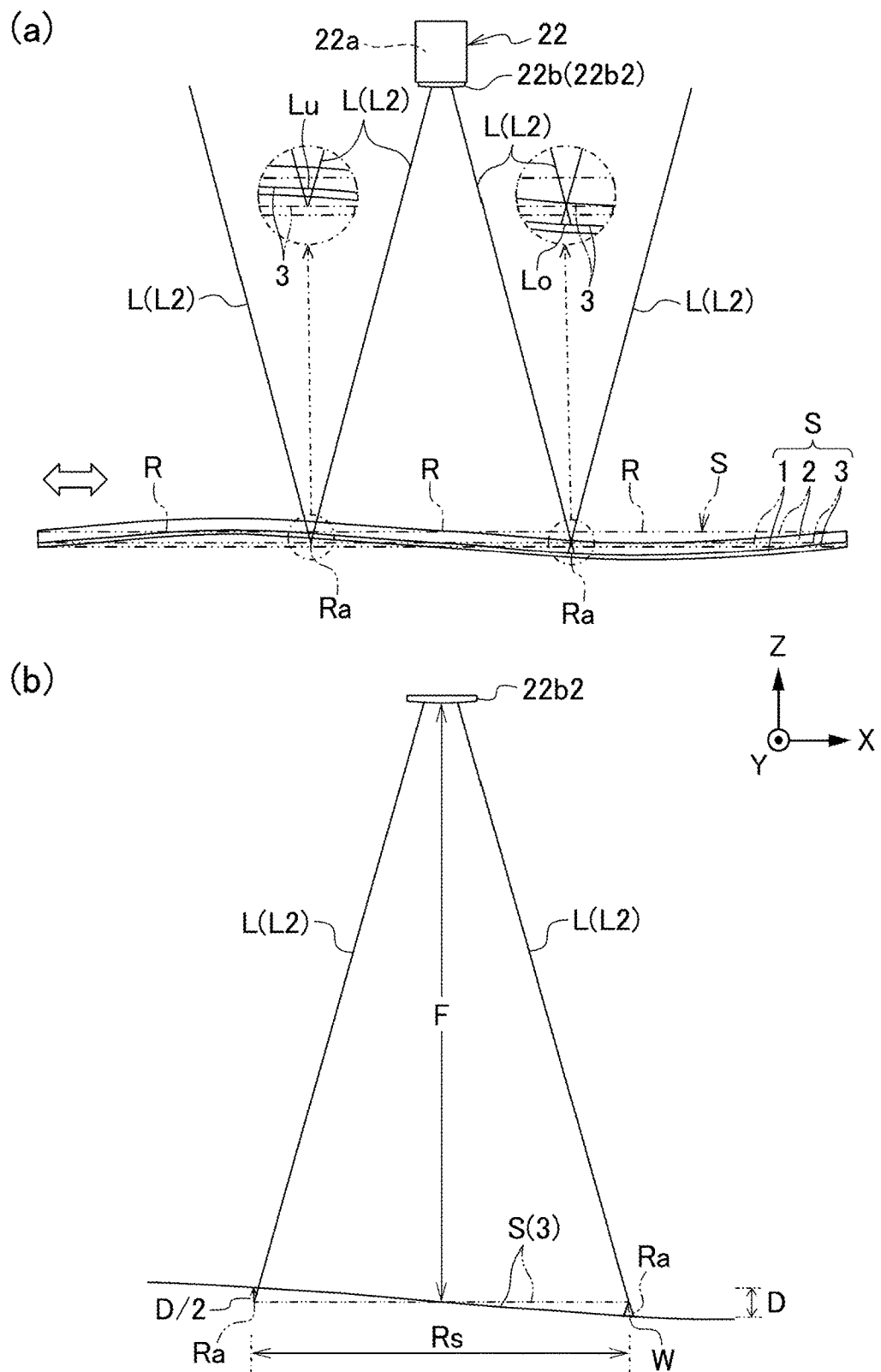
FIG. 12 is an explanatory diagram showing an irradiation state of a laminated body with warpage in which FIG. 12 at (a) is a front view partially enlarging a substantial part and FIG. 12 at (b) is a schematic view of the same.

Furthermore, in the case of the warped laminated body S, as shown in FIG. 12 at (a) and FIG. 12 at (b), since a laser irradiation distance F from the laser scanner 22a to the laminated body S changes according to a warpage shape of the laminated body S, an "unirradiated region Lu" which is not irradiated by the laser beam L or an "overlapping irradiation region Lo" which is irradiated by overlapping laser beams L may be created on the boundary Ra of the plurality of irradiation areas R.

More specifically, when the lens 22b of the laser irradiation part 22 is the non-telecentric lens 22b2, an inclination angle of a main light beam L2 of the laser beam L is diagonal with respect to the separating layer 3 of the laminated body S. In the example shown in FIG. 12 at (a) and FIG. 12 at (b), an aligned irradiation of the laser beam L is performed for each of the plurality of irradiation areas R from the non-telecentric lens 22b2 toward the laminated body S without warpage (two-dot chain line) and the laminated body S which is deformed so as to warp in an approximate S shape in the Z direction (solid line).

With the laminated body S without warpage (two-dot chain line), since a laser irradiation distance from the separating layer 3 to the non-telecentric lens 22b2 on the boundary Ra of each irradiation area R does not change, the unirradiated region Lu and the overlapping irradiation region Lo are not created.

By contrast, with the laminated body S which is deformed so as to warp (solid line), since the laser irradiation distance to the non-telecentric lens 22b2 increases at a location on the boundary Ra of each irradiation area R where the separating layer 3 is depressed toward the non-telecentric lens 22b2, the overlapping irradiation region Lo is created due to overlapping of laser beams L from adjacent irradiation areas R. However, regarding the overlapping irradiation region Lo of the separating layer 3, an experiment demonstrated that using a laser beam with a short oscillation wavelength such as an ultraviolet region (UV) as the laser beam L causes absorption to occur only on the surface of the separating layer 3 and also reduces an effect thereof.

By contrast, at the location on the boundary Ra of each irradiation area R where the separating layer 3 protrudes toward the non-telecentric lens 22b2, since the laser irradiation distance to the non-telecentric lens 22b2 is reduced, the unirradiated region Lu is created. Particularly with the warped laminated body S, the unirradiated region Lu readily occurs when the interval Rb of the laser beam L which is irradiated across the boundary Ra of the plurality of irradiation areas R is set smaller than the beam diameter d of the laser beam L.

In the unirradiated region Lu of the separating layer 3, since a denaturation (change of properties) reaction sufficient for peeling does not occur, a partial peeling failure occurs.

In order to prevent an occurrence of such a partial peeling failure due to warpage of the laminated body S, the interval Rb of the spot like laser beams L of which an aligned irradiation is performed across the boundary Ra of the plurality of irradiation areas R must be set smaller than the beam diameter d of the laser beams L.

In addition thereto, if a short side-side length of the plurality of irradiation areas R is denoted by Rs, an expected warpage amount of the laminated body S is denoted by D, and the laser irradiation distance from the laser scanner 22a to the separating layer 3 is denoted by F, then a width dimension W of overlapping regions of irradiation areas R which are adjacent to each other across the boundary Ra of the plurality of irradiation areas R is preferably set to $Rs*D/(2*F)$ or more.

This is because the expression below can be derived from a schematic view shown in FIG. 12 at (b).

$$F:D/2=Rs:W$$

The expression below can be derived from the expression above.

$$F*W=Rs*D/2$$

The expression below can be derived from the expression above.

$$W=Rs*D/(2*F)$$

In other words, in the case of the warped laminated body S, since setting the width dimension W of overlapping regions of irradiation areas R which are adjacent to each other across the boundary Ra of the plurality of irradiation areas R to Rs*D/(2*F) or more causes irradiation areas R which are adjacent to each other across the boundary Ra to overlap with each other even when a depressed location is created due to warping deformation of the separating layer 3, the unirradiated region Lu is not created.

With the workpiece-separating device A and the workpiece-separating method according to the embodiment of the present invention described above, the laser beam L irradiates the separating layer 3 through the supporting body 2 or the workpiece 1 of the laminated body S being held by the holding member 10 from the laser scanner 22a of the laser irradiation part 22. Due to an operation of the laser scanner 22a, with respect to the plurality of irradiation areas R created by dividing an entire irradiated face of the separating layer 3 into band shapes, an aligned irradiation of the spot like laser beam L is performed for each irradiation area R (each unit irradiation area) from the laser scanner 22a.

Accordingly, the laser beam L evenly irradiates each unit irradiation area R. The laser beam L eventually irradiates all of the plurality of irradiation areas R without creating an irradiation irregularity and the entire face of the separating layer 3 changes properties so that the workpiece 1 and the supporting body 2 can be peeled away from each other.

Therefore, the entire laminated body S can be uniformly irradiated with the spot like laser beam L and the supporting body 2 can be peeled away from the workpiece 1 in an efficient manner.

As a result, compared to a conventional device in which a partial irradiation irregularity of a laser beam readily occurs with respect to a separating layer of a laminated body, since the laser beam L can uniformly irradiate the entirety of the large-area separating layer 3 through the supporting body 2 or the workpiece 1 even when the workpiece 1 is thin and large (large-area), a partial peeling failure does not occur, output of the laser beam L does not become excessively large, and an occurrence of damage to devices formed on the circuit substrate of the workpiece 1 or an occurrence of soot due to partial excessive irradiation can be prevented.

In addition, compared to a conventional device in which a pulse laser beam is irradiated in a spiral shape due to swinging of a scanner, an unirradiated region is not created on the laminated body S and peeling can be performed in an efficient manner.

Therefore, a highly accurate separation of the supporting body 2 from the workpiece 1 can be realized and a clean high-performance product can be manufactured.

In particular, preferably, the driving part 30 is provided which relatively moves, in at least two directions (XY directions), the laser irradiation position P from the laser irradiation part 22 with respect to the supporting body 2 and the separating layer 3 of the laminated body S being held by the holding member 10, and the controlling part 50 controls irradiation of the laser beam L from the laser irradiation part 22 with respect to one irradiation area R among the plurality of irradiation areas R so as to be lined up in two directions (XY directions) due to operations of the laser scanner 22a and the driving part 30.

In this case, due to movement in two directions (XY directions) by the laser scanner 22a and the driving part 30, with respect to the plurality of irradiation areas R created by dividing the entire irradiated face of the separating layer 3 into band shapes, an aligned irradiation of the spot like laser beam L is performed for each irradiation area R (each unit irradiation area) from the laser scanner 22a.

Accordingly, the laser beam L evenly irradiates each unit irradiation area R. The laser beam L eventually irradiates all of the plurality of irradiation areas R without creating an irradiation irregularity and the entire face of the separating layer 3 changes properties so that the workpiece 1 and the supporting body 2 can be peeled away from each other.

Therefore, irradiation of the entire separating layer 3 by the spot like laser beam L can be accelerated and the supporting body 2 can be peeled away from the workpiece 1 in a more efficient manner.

As a result, a highly accurate separation of the supporting body 2 from the workpiece 1 can be realized in a short period of time and a reduction in manufacturing cost can be achieved.

In addition, preferably, the laser irradiation part 22 has the lens 22b which guides the laser beam L from the laser scanner 22a toward the separating layer 3, and the lens 22b is the telecentric lens 22b1 of which the main light beam L2 is arranged parallel to the optical axis L1 of the lens 22b or the non-telecentric lens 22b2 of which the main light beam L2 is arranged at a predetermined angle with respect to the optical axis L1.

In the case of the telecentric lens 22b1 shown in FIG. 1 at (a), FIG. 9 at (a) and FIG. 9 at (b), and the like, since an irradiation angle with respect to the laminated body S is approximately perpendicular, a beam shape (a cross sectional shape) of the laser beam L is not an elliptic shape and circular beam shapes can be lined up as the laser beam L across an entire face of the separating layer 3.

Therefore, the separating layer 3 can be peeled more uniformly with the laser beam L.

As a result, laser peeling can be performed with higher quality even when the workpiece 1 is large (large area).

Furthermore, this is effective when the separating layer 3 is made of an angle-dependent component material of which an absorption rate of the laser beam L differs significantly depending on an incidence angle of the laser beam L.

In addition, in the case of the non-telecentric lens 22b2 shown in FIG. 10 at (a) and FIG. 11 at (a) and FIG. 11 at (b), an approximately circular beam shape is obtained even when an irradiation distance from the laser scanner 22a to the separating layer 3 changes to a certain extent, and even when a position of the separating layer 3 changes in an irradiation direction of the laser beam L due to warpage, the beam shape (cross sectional shape) of the laser beam L less readily changes. In particular, when a size of the plurality of irradiation areas R is relatively small, the beam shape of the laser beam L does not become an ellipse and stable peeling can be performed.

Therefore, even when the separating layer 3 is warped, the separating layer 3 can be uniformly irradiated with the laser beam L and the supporting body 2 can be peeled away from the workpiece 1 in a reliable manner.

As a result, a highly accurate separation of the supporting body 2 from the warped workpiece 1 can be realized and a clean high-performance product can be manufactured.

Furthermore, as shown in FIG. 1 at (a) and FIG. 1 at (b), FIG. 10 at (a) and FIG. 10 at (b), and the like, the driving part 30 preferably has the Y-axis moving mechanism 31 and the X-axis moving mechanism 32 which relatively move the holding member 10 with respect to the laser irradiation part 22 in two directions (XY directions) which intersect a laser irradiation direction (Z direction) from the laser irradiation part 22.

In this case, due to operations of the Y-axis moving mechanism 31 and the X-axis moving mechanism 32, the laminated body S being held by the holding member 10 moves in two directions (XY directions) which intersect the laser irradiation direction (Z direction) and the laser beam L can irradiate the entire face of the separating layer 3 without moving the optical system 20 including the laser irradiation part 22.

Therefore, the separating layer 3 of the laminated body S can be uniformly irradiated by the laser beam L with a simple structure and the supporting body 2 can be readily peeled away from the workpiece 1.

As a result, a structure of the entire device can be simplified and a reduction in manufacturing cost can be achieved.

In addition, as shown in FIG. 8, an interval Rb of the laser beams L which are irradiated across the boundary Ra of the plurality of irradiation areas R is preferably set smaller than the beam diameter d of the laser beams L.

In this case, the laser beams L on opposite sides of the boundary Ra are irradiated so that respective ends come into contact with each other. Therefore, a partial irradiation shortage of the laser beams L does not occur.

Accordingly, an occurrence of a partial peeling failure can be prevented even on the boundary Ra of the plurality of irradiation areas R.

As a result, peeling can be uniformly performed over the entirety of the plurality of irradiation areas R and a high-performance product can be manufactured.

Furthermore, as shown in FIG. 2 at (d), the controlling part 50 preferably controls an irradiation order of the laser beam L to the plurality of irradiation areas R from the laser irradiation part 22 so that the irradiation area R having been irradiated first and the next irradiation area R are irradiated in separate orders.

In this case, by irradiating the irradiation area R having been irradiated first and the next irradiation area R in separate orders, although stress is individually released in adjacent irradiation areas R, an effect of the stress is insignificant since each stress is minute.

Therefore, peeling of an entire face can be performed while preventing internal stress due to warpage from being locally released during irradiation.

As a result, an occurrence of a crack at an interface with the irradiation area R which has not been irradiated or an occurrence of damage to devices formed on the circuit substrate of the workpiece 1 can be prevented, fragmenting of the laminated body S can be completely prevented, and an improvement of yield can be achieved.

In particular, when an entirely of a laminated face of the separating layer 3 is divided into continuous rectangles between both ends of the separating layer 3 as the plurality of irradiation areas R, a takt time can be shortened as compared to squares and stress generated between an region irradiated by the laser beam L and a region not irradiated by the laser beam L can be readily released. Therefore, even when a crack in the workpiece 1 is created by stress acting in a peeling direction due to irradiation conditions of the laser beam L or conditions of a material used in an adhesion region between the workpiece 1 and the separating layer 3 or when soot is created due to irradiation conditions of the laser beam L or conditions of an adhesive material at the adhesion region between the workpiece 1 and the separating layer 3 which reacts to the laser beam L, a crack in the workpiece 1 created when soot flows to a point that has already been peeled can be reliably prevented. Furthermore, by giving the plurality of irradiation areas R having been divided into rectangles a narrow band shape, an occurrence of stress can be further suppressed and an occurrence of a crack in the workpiece 1 can be further prevented.

Moreover, as shown in FIG. 9 at (a) and FIG. 9 at (b) and FIG. 11 at (a) and FIG. 11 at (b), preferably, when each of the plurality of irradiation areas R is irradiated with the laser beam L from the laser irradiation part 22, the controlling part 50 controls an operation of the Z-axis moving mechanism 33 based on a measured value by the length measuring part 40 so that irradiation distances from the laser irradiation part 22 to the plurality of irradiation areas R become approximately constant.

In this case, the irradiation distance between the separating layer 3 of the warped laminated body S being held by the holding member 10 and the laser irradiation part 22 can be adjusted so as to be approximately constant.

Therefore, even when the laminated body S is warped, the laminated body S can be uniformly irradiated by the laser beam L and the supporting body 2 can be readily peeled away from the workpiece 1.

As a result, since the laser beam L uniformly strikes the entire face of the separating layer 3 through the supporting body 2 or the workpiece 1 even when the laminated body S is warped, a partial peeling failure does not occur, output of the laser beam L does not become excessively large, and an occurrence of damage to devices formed on the circuit substrate of the workpiece 1 or an occurrence of soot due to partial excessive irradiation can be prevented.

As a result, a highly accurate separation of the supporting body 2 from the warped workpiece 1 can be realized and a clean high-performance product can be manufactured.

On the other hand, in a case where a spot like top-hat beam irradiates the separating layer 3 through the supporting body 2 or the workpiece 1 of the laminated body S being held by the holding member 10 as the laser beam L from the laser irradiation part 22, an aligned irradiation of the top-hat beam is performed for each irradiation area R (each unit irradiation area) from the laser irradiation part 22 with respect to the plurality of irradiation areas R created by dividing an entire irradiated face of the separating layer 3.

Accordingly, the top-hat beam evenly irradiates each unit irradiation area R. The top-hat beam eventually irradiates all of the plurality of irradiation areas R without creating an irradiation irregularity and the entire face of the separating layer 3 changes properties so that the workpiece 1 and the supporting body 2 can be peeled away from each other.

Therefore, the entire laminated body S can be uniformly irradiated with the spot like top-hat beam and the supporting body 2 can be peeled away from the workpiece 1 in an efficient manner.

As a result, compared to the "edge part LE of the approximately trapezoidal laser beams L1 and L2" described in Japanese Patent Application Laid-open No. 2012-024783, since an overlapping area equal to or less than a decomposition threshold in edge parts of adjacent top-hat beams (a superposition area) becomes narrower, output of the top-hat beams is prevented from becoming excessive and an occurrence of damage to devices on the circuit substrate of the workpiece 1 and an occurrence of soot due to partially excessive irradiation can be further reduced.

Therefore, a highly accurate separation of the supporting body 2 from the workpiece 1 can be realized and a clean high-performance product can be manufactured.

In addition, the width dimension W of overlapping regions of irradiation areas R which are adjacent to each other across the boundary Ra of the plurality of irradiation areas R is preferably set to Rs*D/(2*F) or more.

In this case, since irradiation areas R which are adjacent to each other across the boundary Ra overlap with each other even when the separating layer 3 of the laminated body S deforms so as to warp, an unirradiated region Lu is not created.

Therefore, an occurrence of a partial peeling failure in the separating layer 3 of the warped laminated body S can be prevented.

As a result, the warped laminated body S can be reliably peeled and an improvement of yield can be achieved by preventing partial breakage of the laminated body S.

Furthermore, preferably, the optical component for conversion is a diffraction optical element which changes a laser irradiation shape from the laser irradiation part 22 with respect to the separating layer 3 into a rectangle.

In this case, a laser irradiation shape of the top-hat beam with respect to the separating layer 3 is changed to a rectangular shape.

Therefore, an area (a superposition area) where adjacent top-hat beams overlap with each other can be further reduced.

As a result, since irradiation energy is reduced and excessive irradiation energy is not expended as compared to a case where the laser irradiation shape from the laser irradiation part 22 with respect to the separating layer 3 is a circular shape, an occurrence of damage to devices on the circuit substrate of the workpiece 1 and an occurrence of soot due to partially excessive irradiation can be further reduced and, at the same time, an acceleration of takt can be achieved.

While the workpiece 1 and the supporting body 2 are bonded to each other with the separating layer 3 which is made of a material having an adhesive property in the embodiment described above, the separating layer 3 is not limited thereto and when using the separating layer 3 made of a material that does not have an adhesive property, an adhesion layer (not illustrated) made of an adhesive may be provided between the separating layer 3 and the workpiece 1 and the separating layer 3 and the workpiece 1 may be bonded to each other with the adhesion layer.

In addition, while the illustrated examples indicate a workpiece-side moving type which mainly moves a side of the laminated body S with an optical axis relative moving mechanism to be the driving part 30, this configuration is not restrictive and an optical axis-side moving type may be adopted in which the laser irradiation part 22 is moved by the driving part 30 provided only in a part of the optical system 20.

As a specific example thereof, by moving the laser scanner 22a (the polygon scanner 22a1 or the Galvano scanner 22a2) of the laser irradiation part 22 or the like as a part of the optical system 20 in the Z direction, the laser irradiation position P from the laser scanner 22a can be moved in the Z direction without moving the holding member 10 during an irradiation in the same irradiation area R.

REFERENCE SIGNS LIST

A Workpiece-separating device
S Laminated body
1 Workpiece
2 Supporting body
3 Separating layer
10 Holding member
20 Optical system
22 Laser irradiation part
22a Laser scanner
22b Lens
30 Driving part
50 Controlling part
L Laser beam
L1 Optical axis
P Laser irradiation position
R Irradiation area

The invention claimed is:

1. A workpiece-separating device which, with respect to a laminated body in which a workpiece including a circuit substrate is laminated via a supporting body and a separating layer, peels away the supporting body from the workpiece due to denaturation of the separating layer with an irradiation of a laser beam, the workpiece-separating device comprising:

a holding member which detachably holds one of the workpiece and the supporting body;

a laser irradiation part which irradiates the separating layer with the laser beam through the other of the supporting body and the workpiece of the laminated body being held by the holding member; and a controlling part which controls an operation of the laser irradiation part, wherein the laser irradiation part has a laser scanner which moves the spot like laser beam along the laminated body, an entire irradiated face of the separating layer in an area of the laser beam irradiated from the laser scanner toward the laminated body is divided into a plurality of irradiation areas each having a band shape that is elongated in one of two directions intersecting a light irradiation direction from the laser irradiation part, and the irradiation from the laser scanner with respect to each divided irradiation area is an aligned irradiation in which parts of the spot like laser beams are aligned so as to overlap with each other on a plane intersecting the light irradiation direction, and the controlling part exercises control such that the aligned irradiation is performed by an operation of the laser scanner with respect to one irradiation area of the plurality of irradiation areas divided into band shapes, the aligned irradiation is performed with respect to a next irradiation area after an entirety of the one irradiation area of the plurality of irradiation areas is filled by the aligned irradiation in a gapless manner, and the aligned irradiation is subsequently similarly repeated for each of the irradiation areas so that all of the plurality of irradiation areas are eventually subjected to the aligned irradiation.

2. The workpiece-separating device according to claim 1, comprising a driving part which relatively moves, in at least the two directions, a laser irradiation position from the laser irradiation part with respect to the supporting body and the separating layer of the laminated body being held by the holding member, wherein the controlling part controls an irradiation of the laser beam from the laser irradiation part with respect to one irradiation area among the plurality of irradiation areas so that the aligned irradiation is performed by operations of the laser scanner and the driving part.

3. The workpiece-separating device according to claim 1, wherein the laser irradiation part has an optical component for conversion which changes the spot like Gaussian beam that is pulse-oscillated as the spot like laser beam into a spot like top-hat beam of which an inclination angle of an edge part is approximately perpendicular, and an irradiation from the laser irradiation part with respect to one irradiation area among the plurality of irradiation areas is an aligned irradiation in which parts of the spot like top-hat beams are aligned so as to overlap with each other on a plane intersecting the light irradiation direction.

4. The workpiece-separating device according to claim 1, wherein a width dimension of overlapping regions of irradiation areas which are adjacent to each other across a boundary of the plurality of irradiation areas is set to Rs*D/(2*F) or more,
wherein Rs denotes a short side-side length of the plurality of irradiation areas, D denotes an expected warpage amount of the laminated body, and F denotes a laser irradiation distance from the laser irradiation part to the separating layer.

5. The workpiece-separating device according to claim 3, wherein the optical component for conversion is a diffraction optical element which changes a laser irradiation shape from the laser irradiation part with respect to the separating layer into a rectangle.

6. A workpiece-separating method of, with respect to a laminated body in which a workpiece including a circuit substrate is laminated via a supporting body and a separating layer, peeling away the supporting body from the workpiece due to denaturation of the separating layer with an irradiation of a laser beam, the workpiece-separating method comprising:
a holding process of detachably holding one of the workpiece and the supporting body with a holding member;
a laser irradiation process of irradiating the separating layer with the laser beam from a laser irradiation part through the other of the supporting body and the workpiece of the laminated body being held by the holding member; and
a relative moving process of moving relatively a laser irradiation position from the laser irradiation part with respect to the supporting body and the separating layer of the laminated body being held by the holding member in at least a direction intersecting a laser irradiation direction from the laser irradiation part,
wherein the laser irradiation part has a laser scanner which moves the spot like laser beam along the laminated body,
wherein in the laser irradiation process, an entire irradiated face of the separating layer in an area of the laser beam irradiated from the laser scanner toward the laminated body is divided into a plurality of irradiation areas each having a band shape that is elongated in one of two directions intersecting a light irradiation direction from the laser irradiation part, and the irradiation from the laser scanner with respect to each divided irradiation area is an aligned irradiation in which parts of the spot like laser beams are aligned so as to overlap with each other on a plane intersecting the light irradiation direction, and
wherein in the relative moving process, the aligned irradiation is performed by an operation of the laser scanner with respect to one irradiation area of the plurality of irradiation areas divided into band shapes, the aligned irradiation is performed with respect to a next irradiation area after an entirety of the one irradiation area of the plurality of irradiation areas is filled by the aligned irradiation in a gapless manner, and the aligned irradiation is subsequently similarly repeated for each of the irradiation areas so that all of the plurality of irradiation areas are eventually subjected to the aligned irradiation.

7. The workpiece-separating device according to claim 2, wherein
the laser irradiation part has an optical component for conversion which changes the spot like Gaussian beam that is pulse-oscillated as the spot like laser beam into a spot like top-hat beam of which an inclination angle of an edge part is approximately perpendicular, and
an irradiation from the laser irradiation part with respect to one irradiation area among the plurality of irradiation areas is an aligned irradiation in which parts of the spot like top-hat beams are aligned so as to overlap with each other on a plane intersecting the light irradiation direction.

8. The workpiece-separating device according to claim 3, wherein a width dimension of overlapping regions of irradiation areas which are adjacent to each other across a boundary of the plurality of irradiation areas is set to Rs*D/(2*F) or more,
wherein Rs denotes a short side-side length of the plurality of irradiation areas, D denotes an expected warpage amount of the laminated body, and F denotes a laser irradiation distance from the laser irradiation part to the separating layer.

9. The workpiece-separating device according to claim 7, wherein the optical component for conversion is a diffraction optical element which changes a laser irradiation shape from the laser irradiation part with respect to the separating layer into a rectangle.

* * * * *